US010629770B2

(12) United States Patent
Jain et al.

(10) Patent No.: US 10,629,770 B2
(45) Date of Patent: Apr. 21, 2020

(54) SEMICONDUCTOR METHOD HAVING ANNEALING OF EPITAXIALLY GROWN LAYERS TO FORM SEMICONDUCTOR STRUCTURE WITH LOW DISLOCATION DENSITY

(71) Applicant: Sensor Electronic Technology, Inc., Columbia, SC (US)

(72) Inventors: Rakesh Jain, Columbia, SC (US); Maxim S. Shatalov, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 16/022,856

(22) Filed: Jun. 29, 2018

(65) Prior Publication Data

US 2019/0006553 A1 Jan. 3, 2019

Related U.S. Application Data

(60) Provisional application No. 62/528,001, filed on Jun. 30, 2017.

(51) Int. Cl.
*H01L 21/02* (2006.01)
*H01L 33/00* (2010.01)
(Continued)

(52) U.S. Cl.
CPC ...... *H01L 33/0075* (2013.01); *C23C 16/0272* (2013.01); *C23C 16/303* (2013.01); *C23C 16/34* (2013.01); *C23C 16/56* (2013.01); *C30B 25/183* (2013.01); *C30B 25/186* (2013.01); *C30B 29/403* (2013.01); *C30B 29/406* (2013.01); *C30B 29/68* (2013.01);
(Continued)

(58) Field of Classification Search
CPC ......... H01L 21/02458; H01L 21/02502; H01L 21/02505; H01L 21/0254; H01L 21/0257; H01L 21/02576; H01L 21/0262; H01L 21/02664; H01L 31/1848; H01L 31/1852; H01L 31/1856; H01L 31/1864; H01L 33/007; H01L 33/0075; H01L 33/0095; C23C 16/0272; C23C 16/303; C23C 16/56; C30B 25/183; C30B 29/406
See application file for complete search history.

(56) References Cited

U.S. PATENT DOCUMENTS 9,330,906 B2 5/2016 Shatalov et al.
9,818,826 B2 11/2017 Shatalov et al.
(Continued)

*Primary Examiner* — Stephen W Smoot
(74) *Attorney, Agent, or Firm* — LaBatt, LLC

(57) ABSTRACT

Semiconductor structures formed with annealing for use in the fabrication of optoelectronic devices. The semiconductor structures can include a substrate, a nucleation layer and a buffer layer. The nucleation layer and the buffer layer can be epitaxially grown and then annealed. The temperature of the annealing of the nucleation layer and the buffer layer is greater than the temperature of the epitaxial growth of the layers. The annealing reduces the dislocation density in any subsequent layers that are added to the semiconductor structures. A desorption minimizing layer epitaxially grown on the buffer layer can be used to minimize desorption during the annealing of the layer which also aids in curtailing dislocation density and cracks in the semiconductor structures.

20 Claims, 14 Drawing Sheets

(51) Int. Cl.

| | | |
|---|---|---|
| *H01L 31/18* | (2006.01) | |
| *C30B 29/40* | (2006.01) | |
| *C23C 16/02* | (2006.01) | |
| *C23C 16/34* | (2006.01) | |
| *C30B 25/18* | (2006.01) | |
| *C23C 16/56* | (2006.01) | |
| *C23C 16/30* | (2006.01) | |
| *C30B 29/68* | (2006.01) | |
| *H01L 33/32* | (2010.01) | |
| *H01L 33/12* | (2010.01) | |

(52) U.S. Cl.
CPC .... *H01L 21/0254* (2013.01); *H01L 21/02458* (2013.01); *H01L 21/02505* (2013.01); *H01L 31/1848* (2013.01); *H01L 31/1852* (2013.01); *H01L 31/1856* (2013.01); *H01L 31/1864* (2013.01); *H01L 33/007* (2013.01); *H01L 33/12* (2013.01); *H01L 33/32* (2013.01)

(56) References Cited

U.S. PATENT DOCUMENTS

| | | | |
|---|---|---|---|
| 2006/0003556 A1* | 1/2006 | Lee | H01L 21/0242 438/483 |
| 2007/0138505 A1* | 6/2007 | Preble | C30B 25/02 257/190 |
| 2008/0233721 A1* | 9/2008 | Kosaka | H01L 21/0237 438/493 |
| 2013/0260541 A1* | 10/2013 | Okuno | H01L 21/02458 438/503 |
| 2014/0017840 A1* | 1/2014 | Ou | H01L 21/0237 438/46 |
| 2014/0227864 A1* | 8/2014 | Okuno | H01L 21/0254 438/488 |
| 2014/0326950 A1* | 11/2014 | Shatalov | H01L 21/0237 257/18 |
| 2015/0079803 A1* | 3/2015 | Huang | H01L 21/0237 438/758 |
| 2016/0254411 A1* | 9/2016 | Fukuyama | H01L 33/12 257/76 |
| 2017/0110628 A1 | 4/2017 | Shatalov et al. | |
| 2017/0213718 A1* | 7/2017 | Sundaram | C30B 25/02 |
| 2018/0012753 A1* | 1/2018 | Semond | H01L 21/02381 |

* cited by examiner

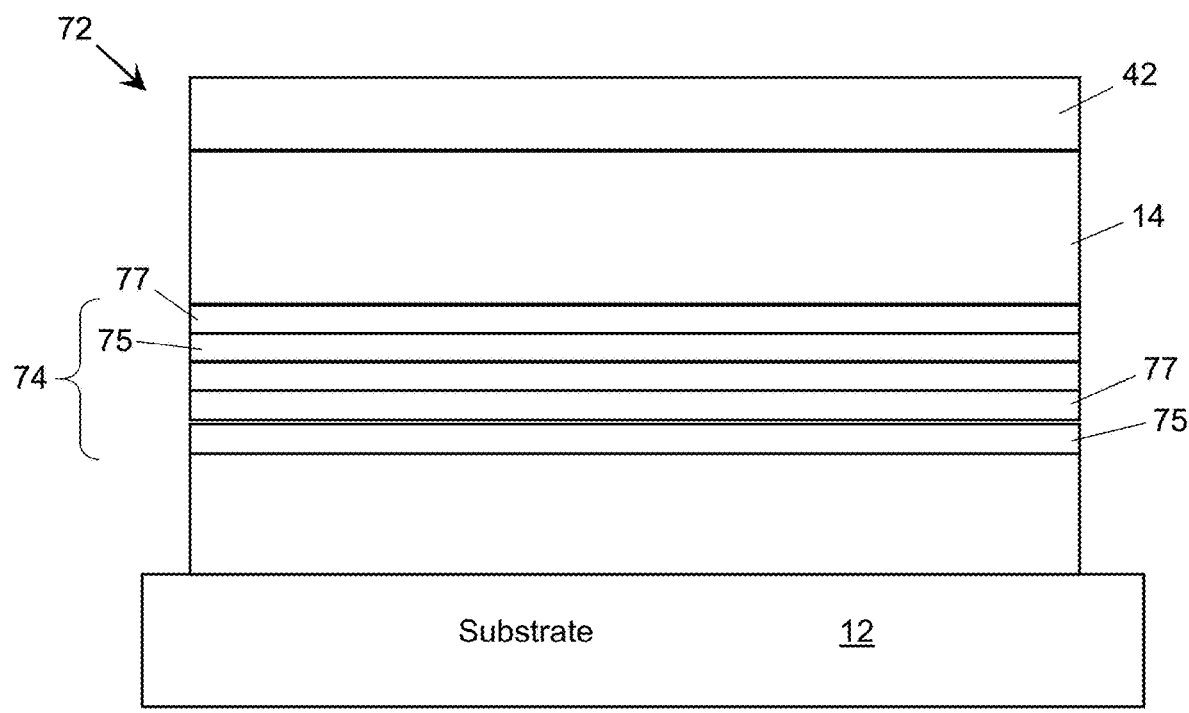

SEMICONDUCTOR METHOD HAVING ANNEALING OF EPITAXIALLY GROWN LAYERS TO FORM SEMICONDUCTOR STRUCTURE WITH LOW DISLOCATION DENSITY

REFERENCE TO RELATED APPLICATIONS

The present patent application claims the benefit of U.S. Provisional Application No. 62/528,001, filed on 30 Jun. 2017, which is hereby incorporated by reference in its entirety to provide continuity of disclosure.

TECHNICAL FIELD

The disclosure relates generally to semiconductor-based devices, and more particularly, to optoelectronic devices formed with semiconductor heterostructures having structures annealed to reduce dislocation density in the structures and in other semiconductor layers formed on the structures.

BACKGROUND ART

Semiconductor-based optoelectronic devices, such as semiconductor emitting and sensing devices, can include light emitting diodes (LEDs) composed of group III-V semiconductors. Ultraviolet (UV) LEDs based on group III nitride semiconductor layers are a subset of LEDs composed of group III-V semiconductors. The performance and reliability of UV LED devices based on group III nitride semiconductor layers are dependent on many factors. The efficiency of these devices is one factor that has a role in the performance and reliability of the device. Typically, the efficiency of UV LEDs based on group III nitride semiconductor layers can be increased by minimizing the dislocation density and the number of cracks in the semiconductor layers. Approaches to minimizing the dislocation density and the number of cracks in these UV LED devices have sought to grow low-defect semiconductor layers on patterned substrates. These substrate patterning approaches typically rely on reducing stresses present in epitaxially grown semiconductor layers. While substrate patterning is a common route to achieving higher quality epitaxial layers, this approach is expensive for production of UV LEDs in large quantities, and does not necessary translate into improvements in performance and reliability.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to improving the performance of optoelectronic devices and/or extending the operational lifetime of the devices by annealing semiconductor structures used to fabricate the devices. Annealing minimizes dislocation density and the number of cracks formed in the semiconductor structures, which leads to better performance of the optoelectronic devices and increases the operational lifetime of the devices. In one embodiment, a semiconductor structure of one the embodiments described herein that can have a low dislocation density through annealing can include a substrate, a nucleation layer of group III nitride semiconductor material formed on the substrate, a buffer layer epitaxially grown at a first temperature T1 on the nucleation layer and annealed at a second temperature T2 that is greater than the first temperature T1, and at least one semiconductor layer formed on the annealed buffer layer that is part of a semiconductor heterostructure (e.g., n-type semiconductor layer, light generating layer and p-type semiconductor layer) used to fabricate an optoelectronic device.

In addition to the buffer layer being epitaxially grown, the nucleation layer and the semiconductor layer(s) formed on the buffer layer after annealing can be epitaxially grown. In one embodiment, the epitaxial growth of these layer can occur in a growth chamber such as a metal organic chemical vapor deposition (MOCVD) chamber. The annealing of the buffer layer and the nucleation layer can also be performed in the same growth chamber. Alternatively, in another embodiment, an annealing chamber which can be used to anneal the nucleation layer and the buffer layer, can also be used for the epitaxial growth of the nucleation layer, the buffer layer, and the semiconductor layer(s).

Generally, the epitaxial growth of the nucleation layer, the buffer layer and the semiconductor layer(s) can occur at temperatures that are typically about 800° to 1300° Celsius, while the annealing can occur at temperatures that are typically 1400° Celsius and above. In one embodiment, the second temperature T2 used for the annealing can range from about 1400° Celsius to about 1900° Celsius. In one embodiment, the second temperature T2 can follow a predetermined time-dependent schedule. In particular, a first portion of the predetermined time-dependent schedule for the annealing can include a relatively fast heating of the nucleation layer and the buffer layer with a temperature that increases a few tens of degrees Celsius per minute from the growth temperature (i.e., the first temperature T1) until reaching a peak temperature. A second portion of the predetermined time-dependent schedule for the annealing can include a relatively constant heating of the nucleation layer and the buffer layer at the peak temperature. A third portion of the predetermined time-dependent schedule for the annealing can include a relatively slow cooling of the nucleation layer and the buffer layer with a temperature that decreases a few tens of degrees Celsius per minute from the temperature of the relatively constant heating of the second portion.

Desorption at the buffer layer during the annealing process, which can lead to dislocations and cracks, can be prevented or minimized by modifying the process. In one embodiment, metalorganic gases containing a predetermined amount of Al and/or Ga atoms can be supplied to the chamber to reverse the desorption of the buffer layer. In one embodiment, a desorption minimizing layer can be formed on the buffer layer to minimize the amount of desorption at a top surface of the buffer layer during the annealing. For example, the desorption minimizing layer along with specifying certain annealing parameters can substantially stop or prevent the desorption. In particular, metalorganic gases containing Al and Ga atoms can be supplied to the chamber and a chamber pressure and temperature can be selected that results in a predetermined amount of absorption of Al and Ga atoms on the surface of the buffer layer during the annealing. In this manner, the rate of desorption of the Al and Ga atoms can be reversed by the absorption of the atoms supplied to the chamber to balance the desorption such that the result is zero net desorption.

In one embodiment, a desorption minimizing layer formed on the buffer layer can be used on its own without supplying the metalorganic gases to the chamber to minimize the amount of desorption at a top surface of the buffer layer during the annealing. The desorption minimizing layer can include a semiconductor layer designed to substantially stop or prevent desorption that is epitaxially grown on the buffer layer prior to annealing. In an embodiment, the semiconductor layer can include an $Al_xGa_{1-x}N$ layer ($0 \leq x \leq 1$). In one embodiment, the semiconductor layer can include In or B. In another embodiment, the semiconductor layer and the buffer layer can include the same composition to form a composite buffer layer. In this manner, metalorganic gases containing Al and Ga atoms can be supplied to the chamber during the annealing, and a chamber pressure and temperature can be selected that causes a predetermined amount of absorption of Al and Ga atoms on the surface of the composite buffer layer that balances the desorption, resulting in zero net desorption.

The desorption minimizing layer can also take the form of a cap layer epitaxially grown on the buffer layer that is designed to substantially stop or prevent desorption during annealing. The cap layer along with the buffer layer can include a group III nitride semiconductor. For example, the buffer layer can include an aluminum nitride layer and the cap layer can include an $Al_xGa_{1-x}N$ layer ($0 \leq x \leq 1$). Other possibilities for the buffer layer can include an AlN layer, while the cap layer can include an AlGaN layer or a layer with In and B. In one embodiment, the cap layer can have a composition that is 5% or more different from the composition of the buffer layer. The cap is not limited to group III nitride semiconductors, and can include other semiconductor layers or dielectric layers.

The cap layer can have a thickness that is sufficient enough to protect the buffer layer during annealing. To this extent, there will be very little desorption of the buffer layer during annealing as the cap layer serves as an effective barrier to desorption. The desorption rate of the cap layer can be controlled through a variation in chamber pressure. For example, the chamber pressure can be increased during annealing to lower the desorption rate of the cap layer, and decreased after annealing in order to quicken the desorption of the cap layer while slowing the desorption from the buffer layer.

In one embodiment, the cap layer can include a laminate structure having multiple cap sub-layers, wherein each cap sub-layer has a different desorption rate. For example, one cap sub-layer can have a high composition of Ga or In to produce a high desorption rate, while another cap sub-layer can have a high molar fraction of AlN to produce a slower desorption rate.

In one embodiment, the cap layer can be removed after annealing prior to epitaxially growing the other semiconductor layer(s) that is part of the semiconductor heterostructure used to fabricate an optoelectronic device. The cap layer can be removed through etching or desorption at a third temperature T3 that is less than the second temperature T2 used for annealing. In one embodiment, an additional buffer layer can be epitaxially grown on the annealed buffer layer and a new cap layer can be epitaxially grown on the additional buffer layer. The new cap layer can then be removed through desorption. This epitaxially growing of more buffer layers and cap layers with annealing and removing of the cap layers can be repeated several times. In this manner, each repeated step leads to the elimination of dislocations within the layers as well as the additional semiconductor layers of the semiconductor heterostructure formed thereon.

Other approaches of reducing desorption rates in the buffer layer during annealing, and thus decreasing the dislocation density, can include making modifications to the buffer layer. In one embodiment, the buffer layer can include more than one buffer sub-layer. For example, each buffer sub-layer can include a quaternary or ternary alloy. In one embodiment, one of the buffer sub-layers can include an $Al_xGa_{1-x}N$ layer with a Ga composition that varies laterally across the buffer sub-layer. Annealing such a buffer layer structure can produce non-uniform morphology and structural changes in each buffer sub-layer. Subsequent semiconductor layers that are grown over this buffer layer structure can provide further control over the morphology which affects the density of threading dislocations presented in the materials.

Another modification to the buffer layer can include epitaxially growing the buffer layer as a laminate structure having multiple buffer sub-layers, wherein each buffer sub-layer can include a composition that differs from a composition of adjacent buffer sub-layers. In one embodiment, at least one of the buffer sub-layers can include discontinuous island domains that extend laterally across the buffer sub-layer, wherein the composition of each discontinuous island domain in a buffer sub-layer differs in composition from the discontinuous island domains in an adjacent buffer sub-layer. In one embodiment, the laminate structure of multiple buffer sub-layers can include a set of tensile stress layers alternating with a set of compressive stress layers. The tensile and compressive stresses provided by these layers can result in neighboring layers having different compositions (e.g., compositions that differ by at least 5%). The tensile and compressive stresses can also result in neighboring layers having different group V/III ratios during the growth of the laminate structure.

Annealing along with other modifications to the buffer layer can be combined to reduce dislocation density and improve the quality of layers in a semiconductor heterostructure. For example, the buffer layer can be epitaxially grown with cavities or voids formed therein. In one embodiment, the buffer layer can be epitaxially grown to have a set of a vertically extending nanostructures such as nanopillars formed in the buffer layer.

Reduction in dislocation density and improved quality of layers can also be obtained by making modifications to the substrate. For example, the substrate can include an inclined surface such that each of the nucleation layer if used, the buffer layer, any desorption minimizing layer if used, and the semiconductor layer(s) of the semiconductor heterostructure can be epitaxially grown with an inclined surface that conforms with the inclined surface of the substrate. In one embodiment, the inclined surface of the substrate can include a series of steps progressing upward from one end of the substrate to another end of the substrate. In one embodiment, the substrate can include a patterned surface with the nucleation layer epitaxially grown on the patterned surface of the substrate.

In one embodiment, multiple substrates (e.g., wafers) can be used to epitaxially grow multiple buffer layers. For example, a large commercial MOCVD chamber can be used to process many wafers at once in order to attain a plurality of buffer layers that can be used to reduce the dislocation density and improve the quality of semiconductor layers formed on these buffer layers. The wafers can then be removed and stacked to ensure that each buffer layer cannot be easily desorbed during annealing. Such a stacked configuration can be placed in a chamber (e.g., an annealing chamber) and annealed to form a template structure (i.e., a buffer layer over a substrate) that can be used for the subsequent growth of the semiconductor layers in the heterostructure of an optoelectronic device.

A first aspect of the invention provides a method, comprising: obtaining a substrate; epitaxially growing a nucleation layer on the substrate, the nucleation layer including a group III nitride semiconductor layer; epitaxially growing a buffer layer directly on the nucleation layer, the buffer layer grown at a first temperature T1; annealing the epitaxially grown buffer layer and the nucleation layer at a second temperature T2, wherein the second temperature T2 is greater than the first temperature T1; and epitaxially growing an n-type doped semiconductor layer over the annealed buffer layer.

A second aspect of the invention provides a method of epitaxially growing a semiconductor structure with low dislocation density, comprising: obtaining a substrate; epitaxially growing a nucleation layer on the substrate, the nucleation layer including a group III nitride semiconductor layer; epitaxially growing a buffer layer on the nucleation layer at a first temperature T1, the buffer layer including a group III nitride semiconductor layer; epitaxially growing a desorption minimizing layer on the buffer layer; annealing the nucleation layer, the buffer layer and the desorption minimizing layer at a second temperature T2, wherein the second temperature T2 is greater than the first temperature T1; and epitaxially growing at least one semiconductor layer over the annealed buffer layer.

A third aspect of the invention provides a method of epitaxially growing a semiconductor structure with low dislocation density, comprising: obtaining a substrate; epitaxially growing a nucleation layer on the substrate, the nucleation layer including a group III nitride semiconductor layer; epitaxially growing a buffer layer on the nucleation layer at a first temperature T1, the buffer layer including a group III nitride semiconductor layer; epitaxially growing a cap layer on the buffer layer; annealing the nucleation layer, the buffer layer and the cap layer at a second temperature T2, wherein the second temperature T2 is greater than the first temperature T1; removing the cap layer after the annealing; and epitaxially growing an n-type semiconductor layer on the annealed buffer layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 10 shows a schematic of a semiconductor structure having a cap layer formed on a buffer layer having a laminate structure with a set of alternating tensile stress layers and compressive stress layers according to an embodiment that is suitable for use with the semiconductor heterostructure depicted in FIG. 1.

FIG. 11A illustrates an example of bowing that can occur in the cap layer and dislocations in the buffer layer of a semiconductor structure during annealing, while

Figure 1:
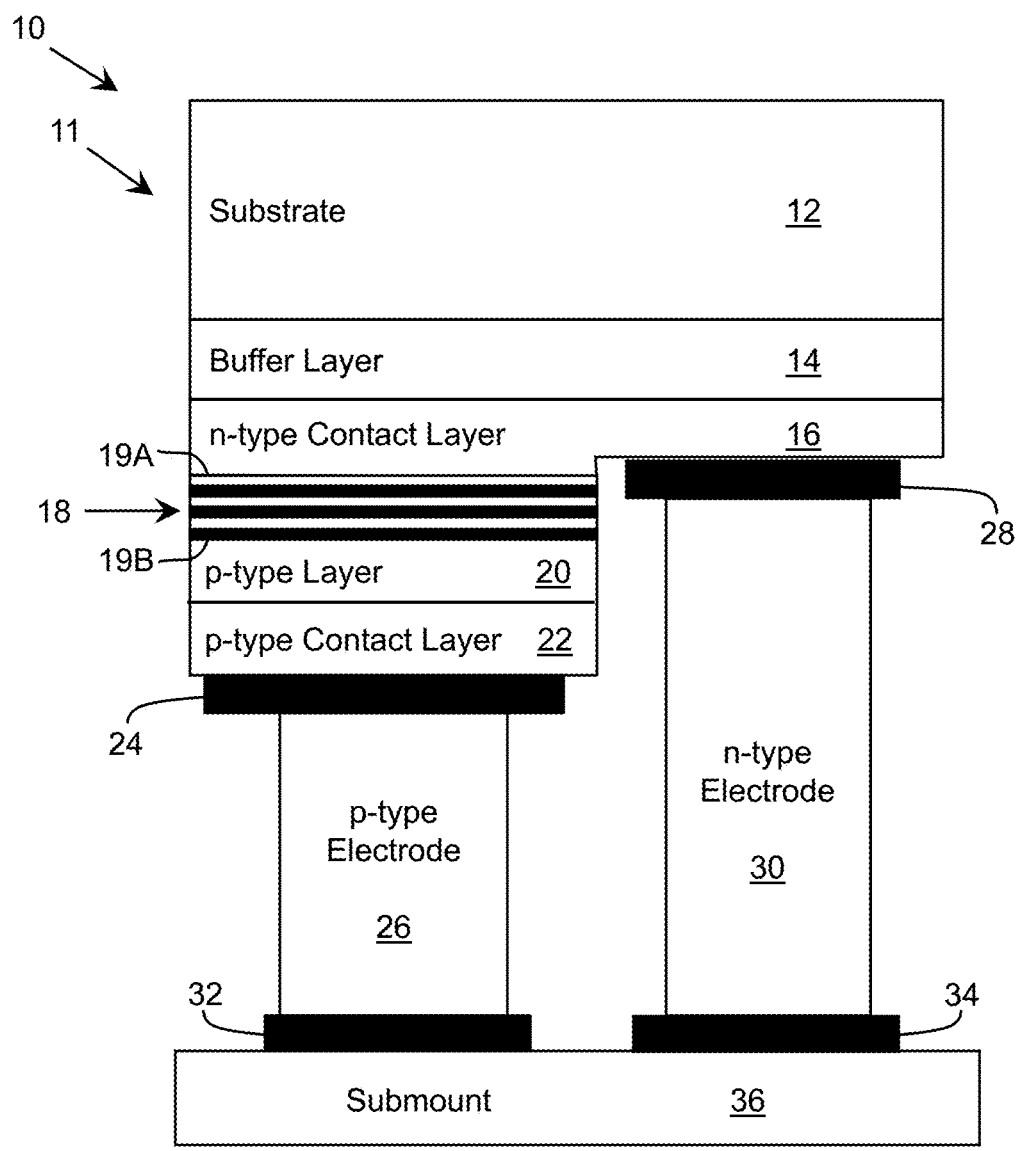
FIG. 1 shows a schematic of an illustrative optoelectronic device having a semiconductor heterostructure according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the present invention are directed to improving the performance of optoelectronic devices and/or extending the operational lifetime of the devices by annealing semiconductor structures used to fabricate the devices. The annealing minimizes dislocation density and the number of cracks formed in the semiconductor structures, which leads to better optoelectronic device performance and increases the operational lifetime of the device.

A layer of any of the semiconductor structures described herein can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by a light generating structure (e.g., peak emission wavelength+/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of any semiconductor structures described herein can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The semiconductor structures described herein can be used to form one of a variety of optoelectronic or electronic devices. Examples of possible optoelectronic and electronic devices can include, but are not limited to, light emitting devices, light emitting diodes (LEDs), including conventional and super luminescent LEDs, light emitting solid state lasers, laser diodes (LDs), photodetectors, photodiodes, and high-electron mobility transistors (HEMTs), ultraviolet LEDs, and ultraviolet LDs. These examples of optoelectronic devices can be configured to emit or sense electromagnetic radiation in an active region upon application of a bias. The electromagnetic radiation emitted or sensed by these optoelectronic devices can comprise a peak wavelength within any range of wavelengths, including visible light, ultraviolet radiation, deep ultraviolet radiation, infrared light, and/or the like. For example, these optoelectronic devices can emit or sense radiation having a dominant wavelength within the ultraviolet range of wavelengths. As an illustration, the dominant wavelength can be within a range of wavelengths of approximately 210 nanometers (nm) to approximately 350 nm.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof. Additionally, as used herein, "vertical" is used to reference the growth direction of the corresponding structure, while "lateral" is used to reference a direction that is perpendicular to the growth direction.

Turning to the drawings, FIG. 1 shows a schematic of an optoelectronic device 10 formed from a semiconductor heterostructure 11. In a more particular embodiment, the optoelectronic device 10 is configured to operate as an emitting device, e.g., an LED, such as a deep ultraviolet light emitting diode (DUV LED) or a conventional or super luminescent LED. Alternatively, the optoelectronic device 10 can be configured to operate as a light emitting solid state laser, a laser diode (LD), a photodetector, a photodiode, or another type of optoelectronic or electronic (e.g., a HEMT) device. Additional aspects of the invention are shown and described in conjunction with the optoelectronic device 10. However, it is understood that embodiments can be utilized in conjunction with any type of optoelectronic device and/or any type of group III nitride-based device.

When the optoelectronic device 10 operates as an emitting device, application of a bias comparable to the band gap results in the emission of electromagnetic radiation from an active region 18 of the device 10. The electromagnetic radiation emitted by the optoelectronic device 10 can comprise a peak wavelength within any range of wavelengths, including visible light, ultraviolet radiation, DUV radiation, infrared light, and/or the like. In an embodiment, the optoelectronic device 10 is configured to emit radiation having a dominant wavelength within the ultraviolet range of wavelengths. In a more specific embodiment, the dominant wavelength is within a range of wavelengths between approximately 210 nanometers and approximately 350 nanometers.

The semiconductor heterostructure 11 of the optoelectronic device 10 can include a substrate 12, a buffer layer 14 (e.g., AlN, an AlGaN/AlN superlattice, and/or the like) adjacent to the substrate 12, an n-type contact semiconductor layer 16 (e.g., an electron supply layer, cladding layer and the like) adjacent to the buffer layer 14, and the active region 18 having an n-type side 19A adjacent to the n-type contact semiconductor layer 16. Furthermore, the heterostructure 11 of the optoelectronic device 10 can include a p-type semiconductor layer 20 (e.g., an electron blocking layer) adjacent to a p-type side 19B of the active region 18 and a p-type contact semiconductor layer 22 (e.g., a hole supply layer, cladding layer, and the like), adjacent to the p-type semiconductor layer 20.

In a more particular illustrative embodiment, the optoelectronic device 10 can be a group III-V materials-based device in which some or all of the various layers of the semiconductor heterostructure 11 are formed of elements selected from the group III-V materials system. In a still more particular illustrative embodiment, the various layers of the semiconductor heterostructure 11 of the optoelectronic device 10 can be formed of group III nitride-based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials can include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride-based optoelectronic device 10 can include an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type contact layer 16 and the p-type semiconductor layer 20 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 20. The substrate 12 can include sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the optoelectronic device 10, a p-type metal contact 24 can be attached to the p-type contact semiconductor layer 22 and a p-type electrode 26 can be attached to the p-type metal contact 24. Similarly, an n-type metal contact 28 can be attached to the n-type contact layer 16 and an n-type electrode 30 can be attached to the n-type metal contact 28. The p-type metal contact 24 and the n-type metal contact 28 can form p-type and n-type ohmic contacts, respectively, to the corresponding layers 22, 16, respectively. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact.

In an embodiment, the p-type metal contact 24 and/or the n-type metal contact 28 can comprise several conductive and reflective metal layers, while the n-type electrode 30 and/or the p-type electrode 26 can comprise highly conductive metal. In an embodiment, the p-type contact semiconductor layer 22 and/or the p-type electrode 26 can be transparent (e.g., semi-transparent or transparent) to the electromagnetic radiation generated by the active region 18. For example, the p-type contact semiconductor layer 22 and/or the p-type electrode 26 can comprise a short period superlattice lattice structure, such as a transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type contact layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Any of the various layers of the device 10 can comprise a substantially uniform composition or a graded composition. For example, a layer can comprise a graded composition at a heterointerface with another layer. In an embodiment, the p-type semiconductor layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the semiconductor heterostructure 11 of the optoelectronic device 10 described herein is only illustrative. To this extent, the semiconductor heterostructure 11 can include an alternative layer configuration, one or more additional layers, and/or the like. As a result, while the various layers are shown immediately adjacent to one another (e.g., contacting one another), it is understood that one or more intermediate layers can be present in the semiconductor heterostructure 11. For example, an illustrative semiconductor heterostructure 11 can include an undoped layer between the active region 18 and one or both of the p-type contact semiconductor layer 22 and the n-type contact semiconductor layer 16 (e.g., an electron supply layer).

Furthermore, the semiconductor heterostructure 11 can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type contact semiconductor layer 22 and the active region 18. Similarly, the semiconductor heterostructure 11 can include a p-type layer 20 located between the p-type contact semiconductor layer 22 and the active region 18. The DBR structure and/or the p-type layer 20 can comprise any composition based on a desired wavelength of the light generated by the device/heterostructure. In one embodiment, the DBR structure comprises a Mg, Mn, Be, or Mg+Si-doped p-type composition. The p-type layer 20 can comprise p-type AlGaN, AlInGaN, and/or the like. It is understood that the semiconductor heterostructure 11 can include both the DBR structure and the p-type layer 20 (which can be located between the DBR structure and the p-type contact layer 22) or can include only one of the DBR structure or the p-type layer 20.

The group III nitride semiconductor layers that can form the semiconductor heterostructure 11 are subject to stresses due to a number reasons that can include hetero-epitaxy, a mismatch between thermal expansion coefficients of the substrate and the layers, variation in semiconductor composition and other factors. All of these factors can lead to the formation of dislocations and cracks in the layers that reduces reliability, performance and operational lifetime of the optoelectronic device 10. Incorporating any of the semiconductor structures described and formed herein with annealing in the semiconductor heterostructure 11 can minimize dislocation density and the number of cracks in the layers. This will enable the optoelectronic device 10 to have better optoelectronic device performance and extend the operational lifetime of the device.

Figure 2:
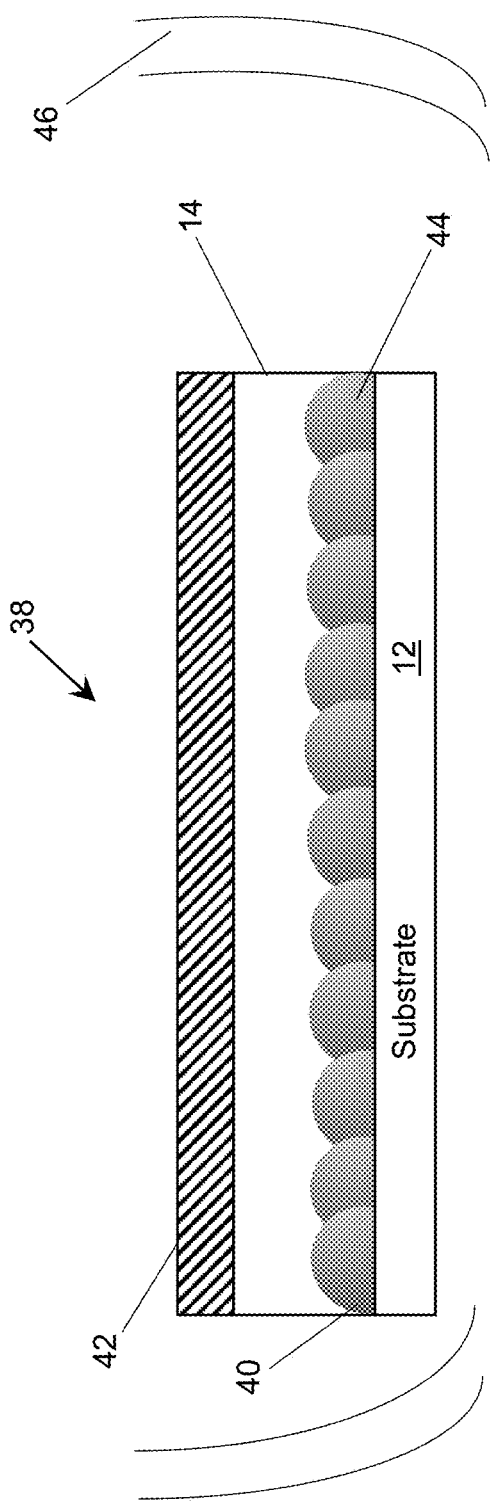
FIG. 2 shows a schematic of a semiconductor structure in a chamber that is suitable for use with the semiconductor heterostructure depicted in FIG. 1 according to an embodiment.

FIG. 2 shows a schematic of a semiconductor structure 38 in a chamber 46 that is suitable for use with the semiconductor heterostructure 11 depicted in FIG. 1 according to an embodiment. For example, the light generating structure of the semiconductor heterostructure 11 can be formed with the semiconductor structure 38. In one embodiment, the semiconductor structure 38 can be coupled to the n-type contact semiconductor layer 16 of the semiconductor heterostructure 11 in FIG. 1. It is understood that the semiconductor structure 38 and other structures disclosed herein can be coupled to or formed with other layers of the light generating structure, or with other portions of the semiconductor heterostructure 11. For example, the semiconductor structure 38 can be coupled to the p-type contact semiconductor layer 20 shown in FIG. 1. Furthermore, it is understood that the semiconductor structure 38 and other structures disclosed herein can be implemented with other types of semiconductor heterostructures used in optoelectronic devices, and are not meant to be limited to application with only the semiconductor structure 11 of the optoelectronic device 10 depicted in FIG. 1.

In one embodiment, as shown in FIG. 2, the semiconductor structure 38 can include a substrate 12, a nucleation layer 40 formed on the substrate, a buffer layer 14 formed on the nucleation layer, and a cap layer 42 formed on the buffer layer. The substrate 12 and the buffer layer 14 can include any of the aforementioned materials such as sapphire, silicon carbide (SiC), silicon (Si), GaN, AlGaN, AlON, $LiGaO_2$, or the like for the substrate 12, while the buffer layer 14 can include any of the aforementioned materials as well as other group III-nitride semiconductor materials. The nucleation layer 40 can also be formed of a group III nitride material. For example, the nucleation layer 40 can include, but is not limited to, AlN, GaN, or the like.

In one embodiment, the nucleation layer 40 can be epitaxially grown on the substrate 12. Epitaxial growth conditions for growing the nucleation layer 40 on the substrate 12 can include, but are not limited to, pulsed ammonia flow, variation of growth temperature, periodic changes of V/III ratio, and/or the like. In one embodiment, the nucleation layer 40 can include a plurality of nucleation islands 44 that extend in a lateral direction over the substrate 12. In general, the nucleation islands 44 can be grown at temperatures of approximately 800 C to approximately 1300 C at a pressure of about 1-760 Torr with V/III ratio ranging between 100-50000. Attributes of the nucleation islands 44 can be controlled by varying one or more growth conditions used during growth of the islands. Illustrative attributes of the nucleation islands 44 can include, but are not limited to, an average size of the islands, a density of the islands (e.g., an average separation distance), an average ratio of vertical size to lateral size of the islands, etc. Illustrative growth conditions used during the growth of the nucleation islands that can be varied include, but are not limited to, a growth temperature, a ratio of group V precursor(s) to group III precursor(s) (i.e., the V/III ratio), a growth duration, a growth pressure, etc. For example, altering the V/III ratio can be used to introduce compressive or tensile stresses within semiconductor layers, while changing the growth duration can be used to increase the density of the nucleation islands 44. Those skilled in the art will appreciate that a multitude of options are possible for obtaining certain attributes, and the selection of growth conditions for yielding such attributes will depend on the desired semiconductor structure and the type of optoelectronic device that it is configured for operation with.

In general, coalescence of the nucleation islands 44 that form the nucleation layer 40 can result in control of the stresses within the subsequently grown semiconductor layers. US Patent Application Publication No. 2017/0110628 provides more information on the formation of nucleation islands for use in a buffer structure of a semiconductor structure and is incorporated herein by reference.

In one embodiment, the buffer layer 14 can be epitaxially grown on the nucleation layer 40. For example, the buffer layer 14 can be epitaxially grown by a pulsed MOCVD approach, wherein ammonia is pulsed during the epitaxial growth. The growth conditions for epitaxially growing the buffer layer 14 on the nucleation islands can include, but are not limited to, adjusting temperature, pressure, V/III ratio, and/or the like.

The cap layer 42 can be epitaxially grown on the buffer layer 14 in order to prevent desorption of the buffer layer. For example, in one embodiment, the cap layer 42 which can include a group III nitride semiconductor with a composition that is different from the buffer layer 14, can be epitaxially grown by a MOCVD approach. In one embodiment, the growth conditions for epitaxially growing the cap layer 42 on the buffer layer 14 can include, but are not limited to, selecting a suitable aluminum nitride molar ratio, temperature, V/III ratio, and/or the like.

Before epitaxially growing the cap layer 42, the buffer layer 14, the nucleation layer 40 including nucleation islands 44 and the substrate 12 can be annealed. In particular, the annealing process of the buffer layer 14, the nucleation layer 40 and the substrate 12 can include heating the semiconductor layers using an appropriate heating schedule, where the pressure and the constituents of the ambient gases are selected to reduce desorption of the material. In one embodiment, the annealing can be performed at an atmospheric pressure that is higher than 1 atm. This ensures reduced desorption of the material from the surface of the semiconductor layer being annealed. In one embodiment, the annealing can be conducted in $NH_3$ ambient without $H_2$. For example, this annealing process could entail increasing the ambient pressure and applying heating to the semiconductor layer. Annealing in $NH_3$ ambient without $H_2$ is beneficial in that there are no chemical reactions of hydrogen and semiconductor surface.

The annealing of the buffer layer 14, the nucleation layer 40 and the substrate 12 results in a low dislocation density in the layers of the semiconductor structure 38, including the cap layer 42, as well as any layers of a semiconductor heterostructure formed on the semiconductor structure 38. As used herein, a low dislocation density means a dislocation density on the order of $10^8$ dislocations per square centimeter or less. In one embodiment, the annealing of the buffer layer 14, the nucleation layer 40, and the substrate 12 is at a temperature that is greater than the temperature used for the epitaxial growth of the buffer layer. For example, the buffer layer 14, the nucleation layer 40 and the substrate 12 can be annealed at temperatures that are 1400° C. and above. In one embodiment, the annealing temperature can range from about 1400° Celsius to about 1900° Celsius, while the temperature range for epitaxially growing the buffer layer 14 can range from about 800° C. to about 1200° C.

Annealing the buffer layer 14, the nucleation layer 40, and the substrate 12 prior to epitaxially growing any other additional layers in the semiconductor structure 38, as well as any other layers in a semiconductor heterostructure that forms a part of an optoelectronic device, with a temperature that is greater than the epitaxial growth temperature results in a low dislocation density due to dislocation annihilation and further elimination of point defects and defects originating at the grain boundaries of the coalescent nucleation islands. Structures without annealing typically suffer from a larger number of defects, as well as inhomogeneous surface morphology that can detrimentally affect the subsequently epitaxially grown semiconductor layers.

The chamber 46 that is depicted in FIG. 2 can be a growth chamber or an oven. For example, the chamber 46 can include a metal organic chemical vapor deposition (MOCVD) chamber that is configured to deposit very thin layers of atoms of compound semiconductors (e.g., group III-V compound semiconductors) on a wafer substrate. In one embodiment, the nucleation layer 40 including the nucleation islands 44 and the buffer layer 14 can be epitaxially grown in a MOCVD chamber and also annealed in that same chamber. The cap layer 42 and any subsequent layers of the semiconductor structure 38 and the semiconductor heterostructure of an optoelectronic device can be epitaxially grown in the same MOCVD chamber after annealing. While it is convenient and technologically simple to grow the semiconductor structure 38 and other layers of a semiconductor heterostructure of an optoelectronic device in an MOCVD chamber, it is understood that the growth can also be done in an annealing chamber or oven. For example, the nucleation layer 40 including the nucleation islands 44, and the buffer layer 14 can be epitaxially grown in an annealing chamber and also annealed in that same chamber. Similarly, the cap layer 42 and any subsequent layers of the semiconductor structure 38 and the semiconductor heterostructure of an optoelectronic device can be epitaxially grown in that same annealing chamber after annealing.

Figure 3:
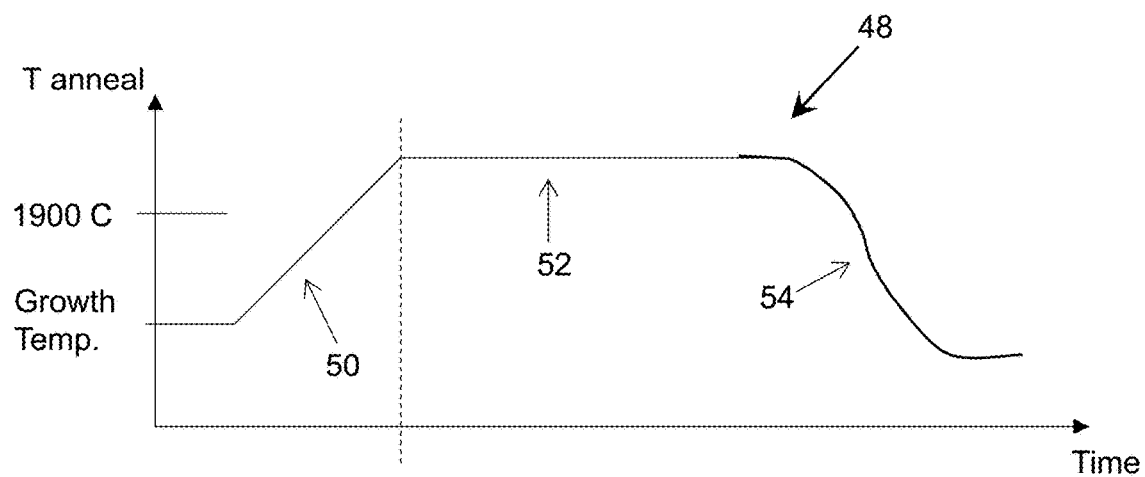
FIG. 3 shows an example of an annealing profile as a function of time that can be used in the annealing of the semiconductor structures described herein.

FIG. 3 shows an example of an annealing profile 48 illustrating an annealing temperature schedule as a function of time that can be used in the annealing of the semiconductor structure 38 depicted in FIG. 2, as well as any of the other semiconductor structures described herein. As shown in FIG. 3, a first portion 50 of the annealing profile 48 can include a relatively fast heating (e.g., approximately 1 hour) of the buffer layer 14 and the nucleation layer 40 with a temperature that increases a few tens of degrees Celsius per minute from the temperature used for epitaxial growth until reaching a peak temperature that can range from about 1400° Celsius to about 1900° Celsius. A second portion 52 of the annealing profile 48 can include a relatively constant heating of the buffer layer 14 and the nucleation layer 40 at the peak temperature for approximately 2 hours. It is understood that the peak temperature can have a small amount of variation from the peak temperature (e.g., a few degrees Celsius per minute). A third portion 54 of the annealing profile 48 can include a relatively slow cooling of the buffer layer 14 and the nucleation layer 40 (e.g., approximately 1 hour) with a temperature that decreases a few tens of degrees Celsius per minute from the temperature of the relatively constant heating of the second portion 52. An annealing process that incorporates an annealing profile like the one described with respect to FIG. 3 can improve the crystalline nature of the semiconductor structure.

It is understood that the results of the annealing can be affected by the size of the semiconductor structure that is to be annealed. For example, the quality of the layers in the semiconductor structure 38 of FIG. 2, such as the orientation of the domains resulting when the nucleation islands have coalesced within the layers, can be improved. In addition, the dislocation density in the layers of the semiconductor structure 38, as well as the layers of a semiconductor heterostructure of an optoelectronic device that can be formed on the structure 38, can be reduced if the layers of the semiconductor structure are sized with dimensions that are conducive for obtaining such results from an annealing operation. In one embodiment, the nucleation layer 40, the buffer layer 14, and the cap layer 42 can have a thickness that ranges from about 10 nm to about 500 nm. For example, the nucleation layer 40 can have a thickness that ranges from about 5 nm to about 50 nm, the buffer layer 14 can have a thickness that ranges from about 50 nm to about 500 nm, while the cap layer 42 can have a thickness that ranges from about 1 nm to about 100 nm. It is possible to anneal much thicker layers (e.g., 1-2 microns) as well, but it has been determined that annealing thinner layers leads to improvement in the quality of the semiconductor layers (e.g., improved orientation of domains) and reduced dislocation density. In order to reduce substrate bowing during the annealing, the substrate 12 can have a thickness that is at least 100 microns. In one embodiment, the substrate can have a thickness that ranges from about 300 microns to about 400 microns.

Figure 4:
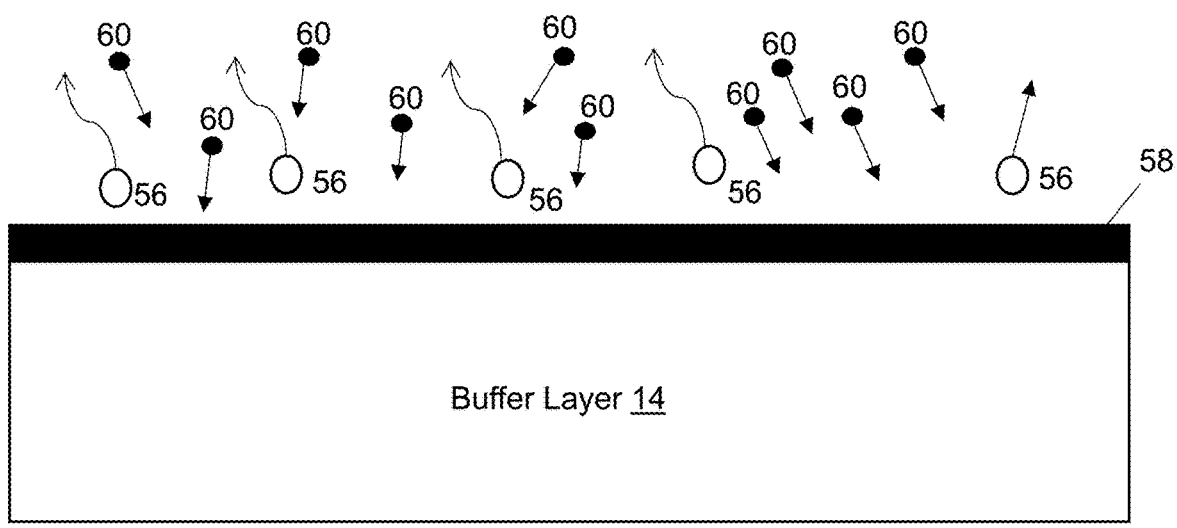
FIG. 4 shows an example of possible flow dynamics that can occur at a buffer layer in a semiconductor structure like the one depicted in FIG. 2, but without a nucleation layer and a cap layer, while undergoing annealing according to an embodiment.

FIG. 4 shows an example of possible flow dynamics that can occur at a buffer layer 14 in a semiconductor structure like the one depicted in FIG. 2, but without a nucleation layer and a cap layer, while undergoing annealing. In particular, FIG. 4 illustrates that during the annealing of a semiconductor layer such as the buffer layer 14, the semiconductor material of the layer will desorb. FIG. 4 shows the desorption, which is represented by reference element 56, that can occur at a surface 58 of the buffer layer 14 during the annealing due to thermal processes. This desorption can negatively affect the surface 58 of the annealed buffer layer 14 because semiconductor regions in the vicinity of dislocations can result in a higher desorption rate. The higher desorption rate can cause a non-smooth morphology of the surface, which results in a lower quality of subsequently grown semiconductor layers. In one embodiment, the desorption can be countered by supplying metalorganic gases at the surface 58 of the buffer layer 14 during the annealing. In FIG. 4, the flow of metalorganic gases is represented by reference element 60. The flow of metalorganic gases will counter the desorption by the absorption rate of the material from the metalorganic gases partially balancing the desorption rate.

In one embodiment, metalorganic gases containing Al and Ga can be supplied into the chamber during the annealing to produce an adequate pressure that reverses the desorption process. In one embodiment, a chamber pressure and a chamber temperature can be selected to attain a predetermined amount of Al and Ga atoms that are absorbed into the surface 58 of the buffer layer 14 during the annealing that balances a rate of desorption of atoms from the surface 58. For example, at a temperature of 1600° Celsius and a pressure of 700 torr, an approximately net zero desorption of the buffer layer 14 can be attained. In this manner, balancing the rate of desorption with the absorption of the Al and Ga atoms can be used to attain zero net desorption at the buffer layer 14.

Figure 5A:
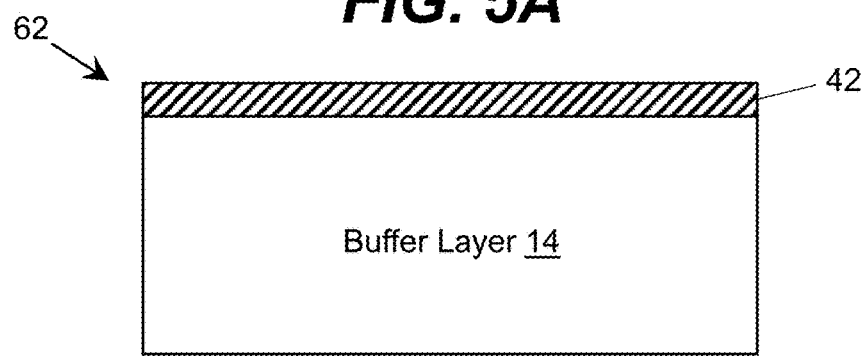
FIGS. 5A-5D schematically show the epitaxial growth and removal of a cap layer in a semiconductor structure like the one depicted in FIG. 2 according to an embodiment.

FIGS. 5A-5D show another approach in how the cap layer 42 can be used to act as a desorption minimizing layer that limits desorption of a buffer layer 14 in a semiconductor structure 62 during annealing of the structure to an acceptable value that is determined from experimentation. For clarity, other layers of the semiconductor structure 62 have been omitted in order to show how the cap layer 42 can limit desorption at the buffer layer 14 during growth and annealing of the structure. The epitaxial growth of the cap layer 42 on the buffer layer 14 in the semiconductor structure 62 and removal of the cap layer from the structure begins at FIG. 5A. In particular, FIG. 5A show the growth stage where the cap layer 42 is epitaxially grown on the buffer layer 14 in any of the aforementioned approaches. For example, the cap layer 42 can be epitaxially grown on the buffer layer 14 in an MOCVD chamber and subsequently annealed in that chamber. The cap layer 42 could also be epitaxially grown on the buffer layer 14 in a growth chamber and subsequently annealed in that chamber. In one embodiment, the cap layer 42 can be epitaxially grown on the buffer layer 14 in an MOCVD chamber and removed from that chamber for annealing in an annealing chamber. It is understood that the cap layer 42 can be formed on the buffer layer 14 using other approaches. For example, the cap layer 42 can be deposited on the buffer layer 14 using sputtering.

The buffer layer 14 and the cap layer 42 can each comprise a group III nitride semiconductor. In one embodiment, the cap layer 42 can have a composition that is 5% or more different from the composition of the buffer layer 14. For example, the buffer layer 14 can include an aluminum nitrate layer and the cap layer 42 can include an $Al_xGa_{1-x}N$ layer. In one embodiment, the buffer layer 14 can include an AlN, AlGaN, or GaN layer and the cap layer 42 can include an AlGaN layer. In one embodiment, the cap layer 42 can further include In and/or B.

While it is more convenient from a technological perspective to have the cap layer 42 be a semiconductor layer, it is understood that the cap layer can include other types of material. For example, the cap layer 42 can include a dielectric such as, but not limited to, $SiO_2$, Si, $Al_2O_3$, $CaF_2$, $MgF_2$, $Si_3N_4$, $HfO_2$, and similar dielectrics.

In order to provide adequate protection to the buffer layer 14 during the annealing, the cap layer 42 can have a thickness that results in minimal if any desorption of the buffer layer. In one embodiment, the buffer layer 14 can have a thickness that ranges from about 100 nm to about 10 microns. It is understood that the selection of a thickness for the cap layer 42 will depend on the thickness of the buffer layer 14. For example, if the buffer layer 14 has a relatively larger thickness (e.g., 4 microns), then the cap layer 42 can have a thickness of 10 nm. Alternatively, if the buffer layer 14 has a relatively smaller thickness (e.g., 1000 nm), then the cap layer 42 can have a thickness of 5 nm. In this manner, the cap layer 42 can provide an effective barrier to desorption of the buffer layer during the annealing. As used herein, an effective barrier to desorption means a layer that reduces the desorption rate by at least 50%.

Figure 5B:
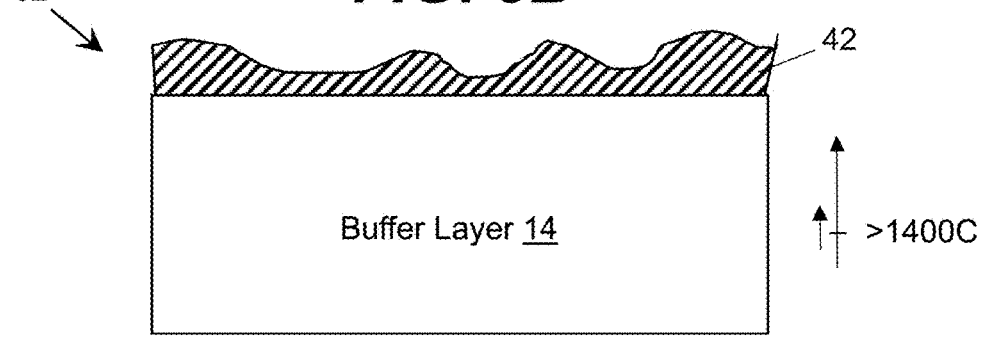

FIG. 5B schematically depicts an annealing process being performed on the semiconductor structure 62. In one embodiment, as shown in FIG. 5B, the annealing can utilize an annealing temperature that is greater than 1400° Celsius. To this extent, there will be partial desorption (i.e., some evaporation of the atoms from the surface of the semiconductor layer) due to the high temperature. While partial desorption may not be desirable, it is a byproduct of a high annealing temperature that can be highly beneficial for improving the quality of semiconductor layers.

Figure 5C:
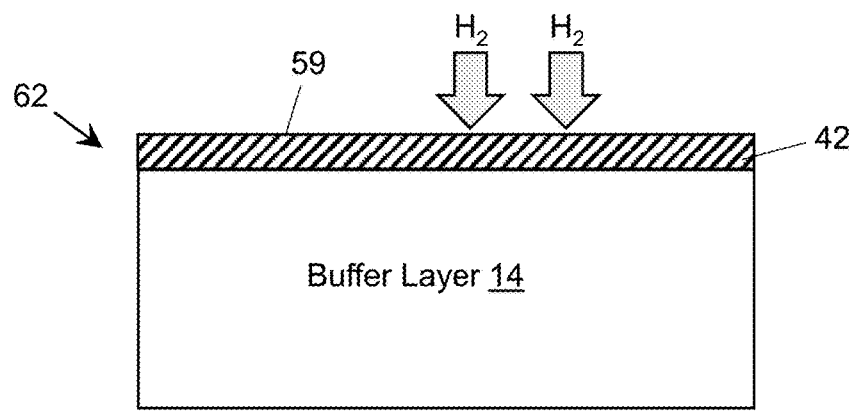

The cap layer 42 can be removed from the buffer layer 14 after annealing in order to promote subsequent semiconductor growth. FIG. 5C schematically depicts the removal of the cap layer 42 from the buffer layer 14 according to an embodiment. For example, the cap layer 42 can be removed by etching under an application of gases directed to a top surface 59 of the cap layer in a high temperature environment. In one embodiment, the gases, which can include $H_2$, are applied to the surface 59 of the cap layer 42 at a temperature that can range from about 1000° C. to about 1900° C. It is understood that adjusting gas parameters, such as flow and/or pressure, can lead to an increased removal rate of the cap layer 42 from the buffer layer 14. Also, it is understood that other gases, such as chlorine, can be used to effectuate the removal of the cap layer 42 from the buffer layer 14.

In another embodiment, the cap layer 42 can be removed from the buffer layer 14 through further desorption. For example, the desorption can be attained by changing the pressure in the chamber to a value or range of values that are different from the annealing pressure. In one embodiment, utilizing a pressure that is less than the annealing pressure can lead to eventual desorption in the cap layer 42. This desorption eventually causes the cap layer 42 to breakdown and eventually wear away due to cap evaporation.

Figure 5D:
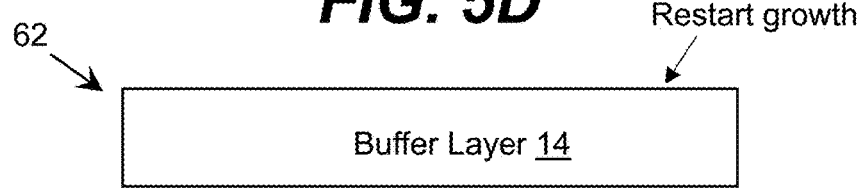

After annealing the buffer layer 14 and the cap layer 42 and removing the cap layer, the semiconductor structure 62 can be used to grow other layers on the buffer layer as shown in FIG. 5D. For example, semiconductor layers from a semiconductor heterostructure used in an optoelectronic device can be formed on the semiconductor structure 62 or other layers that form the structure can be grown on the buffer layer 14.

Figure 6A:
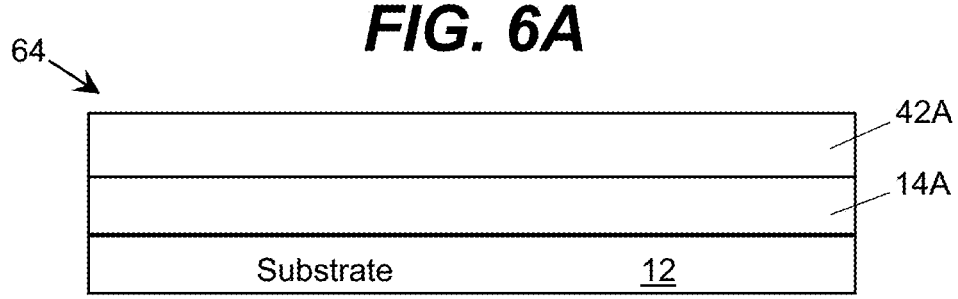
FIGS. 6A-6D schematically show a repeated process of epitaxially growing a buffer layer and a cap layer, annealing the layers, and removing the cap layer, with each step leading to the elimination of dislocations according to an embodiment.
Figure 6B:
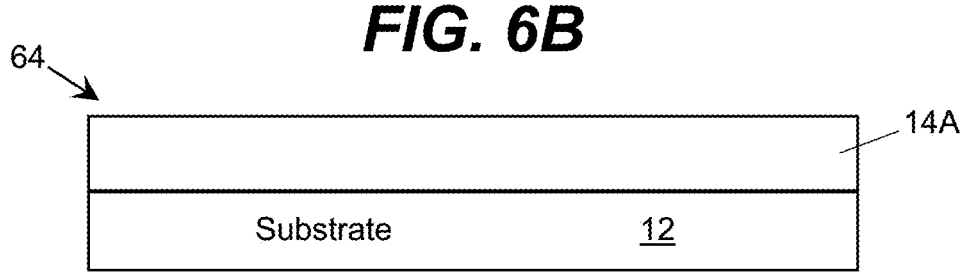

In one embodiment, the epitaxial growing, annealing and removal of the cap layer 42 can be repeated several times with each step leading to elimination of dislocations in these layers, as well as within any other semiconductor layers added to the semiconductor structure. FIGS. 6A-6D show an example illustrating a repeated process of epitaxially growing a buffer layer 14 and a cap layer 42 for a semiconductor structure 64, annealing the layers, and removing the cap layer. The process begins in FIG. 6A, where the buffer layer 14 (i.e., 14A) is epitaxially grown on the substrate 12, and the cap layer 42 (i.e., 42A) is epitaxially grown on the buffer layer 14 (14A). The epitaxial growth of these layers can be performed in any of the aforementioned approaches. The buffer layer 14A and the cap layer 42A can be annealed as depicted in FIG. 6B. The annealing can use an annealing profile like the one discussed above (FIG. 3) to anneal the semiconductor structure 64. FIG. 6B also depicts the removal of the cap layer 42A from the semiconductor structure 64 through desorption. It is understood that the desorption process discussed above with regard to FIG. 5C can be used to remove the cap layer 42A from the buffer layer 14A in this embodiment. As noted above, the semiconductor structure 64 that remains will have been processed in a manner that reduces the presence of dislocations in subsequently added layers.

Figure 6C:
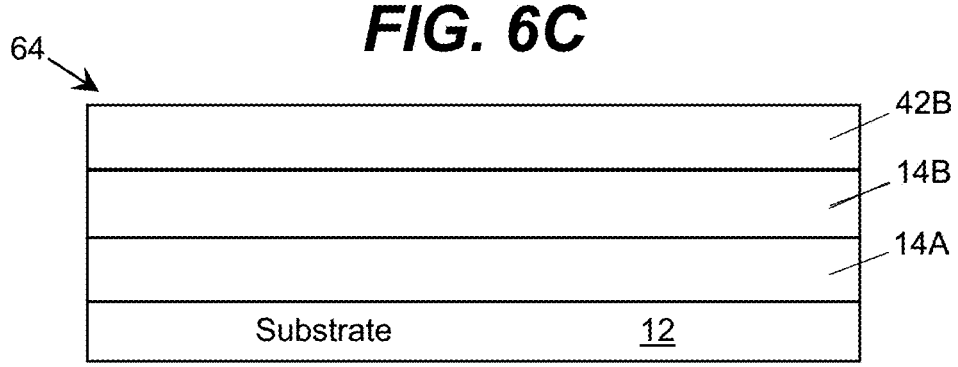
Figure 6D:
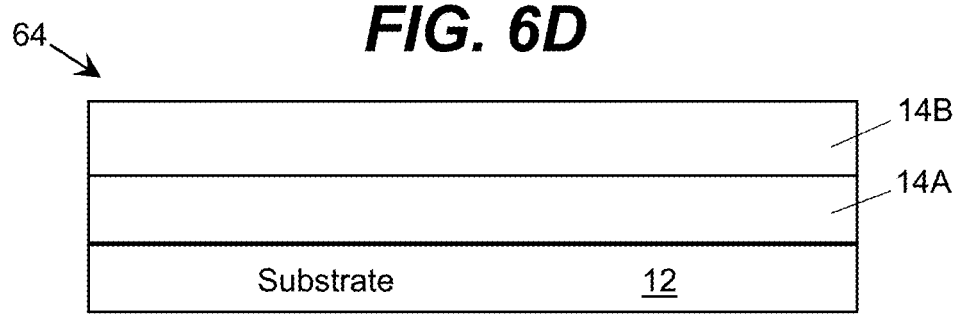

FIG. 6C shows that an additional buffer layer 14B can be epitaxially grown on the annealed buffer layer 14A, and a new cap layer 42B can be grown on the additional buffer layer 14B. The cap layer 42B and the buffer layers 14A and 14B can then be annealed, with the cap layer 42B being removed from the semiconductor structure 64 through desorption as depicted in FIG. 6D. These steps of epitaxially growing more buffer layers and cap layers, annealing and removing the cap layers can repeated as desired, with each step leading to further reduction in the presence of dislocations and cracks, and an overall higher quality structure. In general, the amount of repetition of these steps will depend on the type of semiconductor structure and its layers, and the desired quality of the layers (e.g., reduced presence of dislocations and cracks).

Figure 7A:
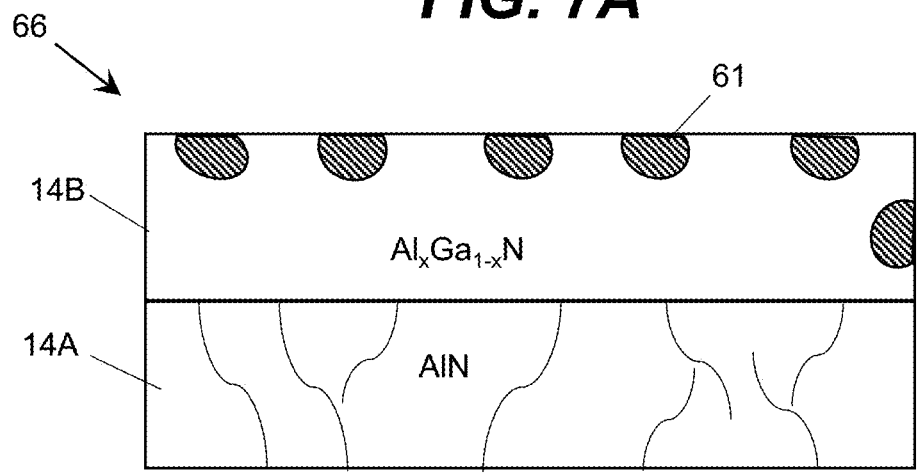
FIGS. 7A-7B schematically show the epitaxial growth and annealing of a buffer layer with at least one buffer sub-layer according to an embodiment.
Figure 7B:
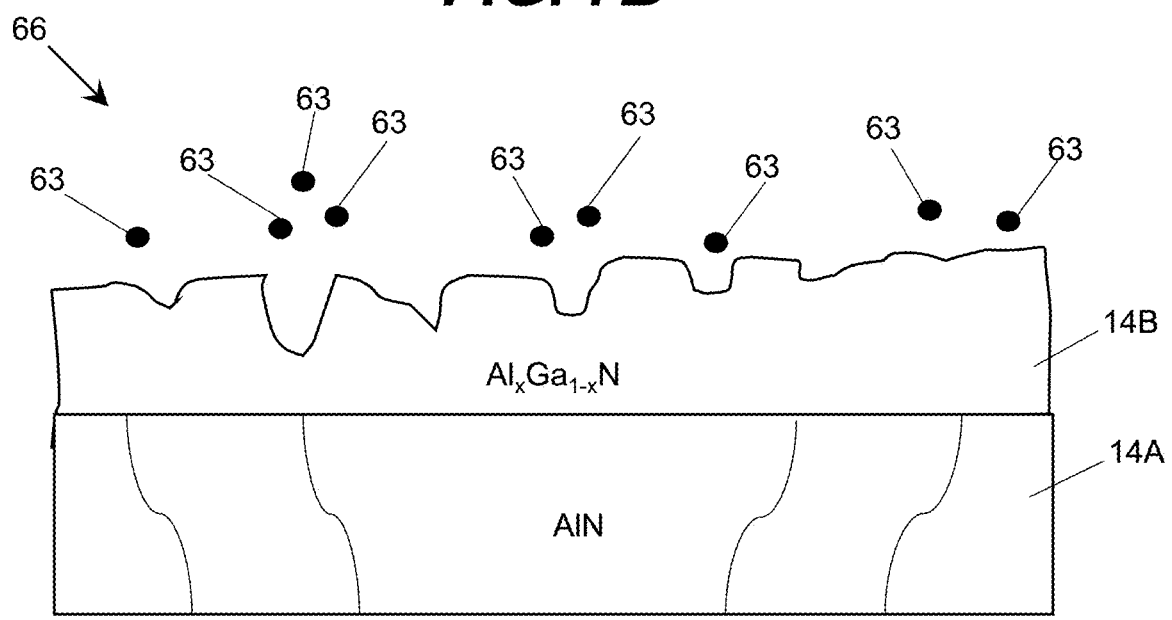

Reducing the effects that desorption can have on the buffer layer of a semiconductor structure during annealing can be attained using other approaches. For example, the buffer layer can be configured with a desorption minimizing layer. In one embodiment, the buffer layer can have more than one buffer sub-layer that acts as a desorption minimizing layer during an annealing process. FIGS. 7A-7B schematically show the epitaxial growth and annealing of a buffer layer with at least one buffer sub-layer according to an embodiment. In particular, FIG. 7A shows a semiconductor structure 66 having a buffer layer 14A with a buffer sub-layer 14B epitaxially grown on the buffer layer 14A. For clarity in describing the desorption that occurs in the buffer layer of the semiconductor structure 66, only the buffer layer 14A and the buffer sub-layer 14B are depicted. It is understood that the semiconductor structure 66 can have other layers. Furthermore, although the semiconductor structure 66 is only depicted in FIG. 7A with one buffer sub-layer 14B, it is understood that the structure can have additional buffer sub-layers.

Each buffer sub-layer can include a quaternary or ternary alloy. In one embodiment, as shown in FIG. 7A, the buffer sub-layer 14B can include an $Al_xGa_{1-x}N$ layer while the buffer layer 14A can include an AlN layer. The $Al_xGa_{1-x}N$ layer that forms the buffer sub-layer 14B can have a Ga composition that varies laterally across the sub-layer as a variation of the Ga composition can lead to different desorption rates. For example, in one embodiment, regions 61 in the $Al_xGa_{1-x}N$ layer with a higher Ga composition can have a higher desorption rate than regions in the $Al_xGa_{1-x}N$ layer with a higher Al composition (not shown for clarity). As used herein, a high or higher Ga/Al composition means the Ga/Al composition is several percent higher than the Ga/Al composition of neighboring semiconductor domains, and a high or higher desorption rate means a desorption rate that is several percent higher than the desorption rate of neighboring regions.

FIG. 7B shows the semiconductor structure 66 undergoing annealing and desorption. In one embodiment, as shown in FIG. 7B, the annealing can utilize an annealing temperature that is greater than 1400° Celsius. For example, the annealing can utilize an annealing profile like the one discussed above (FIG. 3) to effectuate an anneal of the semiconductor structure 66. During the annealing, Ga atoms from the regions 61 (FIG. 7A) in the $Al_xGa_{1-x}N$ layer with a higher Ga composition can undergo desorption as represented by reference elements 63 (FIG. 7B).

The annealing and desorption of the semiconductor structure 66 can lead to non-uniform morphology and structural changes in the buffer sub-layer 14B as shown in FIG. 7B. For example, non-uniform morphology in the buffer sub-layer 14B can include, but are not limited to, rough surface of the buffer layer with the roughness reaching several nanometers, while the structural changes can include, but are not limited to, threading and point dislocations. In general, the non-uniform morphology and structural changes that can form in the buffer sub-layer 14B are due to thermal processes that lead to changes within the semiconductor structure as well as evaporation of semiconductor material from the surface of the semiconductor layer.

Although not depicted in FIGS. 7A-7B, it is understood that the process can include other actions. For example, additional layers of the semiconductor structure 66 can be epitaxially grown on the annealed buffer layer 14A and buffer sub-layer 14B, as well as the semiconductor layers of a semiconductor heterostructure that form an optoelectronic device can be grown on the annealed buffer sub-layers. To this extent, the non-uniform morphology and structural changes in the buffer sub-layer 14B can control the morphology and threading dislocation density of subsequent epitaxial growth of any semiconductor layers. In particular, a rough surface of the buffer layer can lead in dislocation propagation in the subsequent semiconductor layers.

It is understood that the $Al_xGa_{1-x}N$ layer for the buffer sub-layer 14B can also function as a desorption minimizing layer without having any variation in the Ga composition. Furthermore, it is understood that the buffer sub-layer 14B can include other group III nitride semiconductors and still act as a desorption minimizing layer to the buffer sub-layer 14A. For example, the buffer sub-layer can include In or B. In one embodiment, the buffer sub-layer 14B and the buffer sub-layer layer 14A can have the same composition to form a composite buffer layer. This composite buffer layer can be annealed in the manner described above with respect to FIG. 4 to minimize desorption. For example, metalorganic gases (e.g., Al and Ga) can be supplied into the annealing chamber, while the chamber pressure and temperature can be selected to obtain a certain amount of absorption in the composite buffer layer that balances the desorption such that there is net zero desorption.

Figure 8:
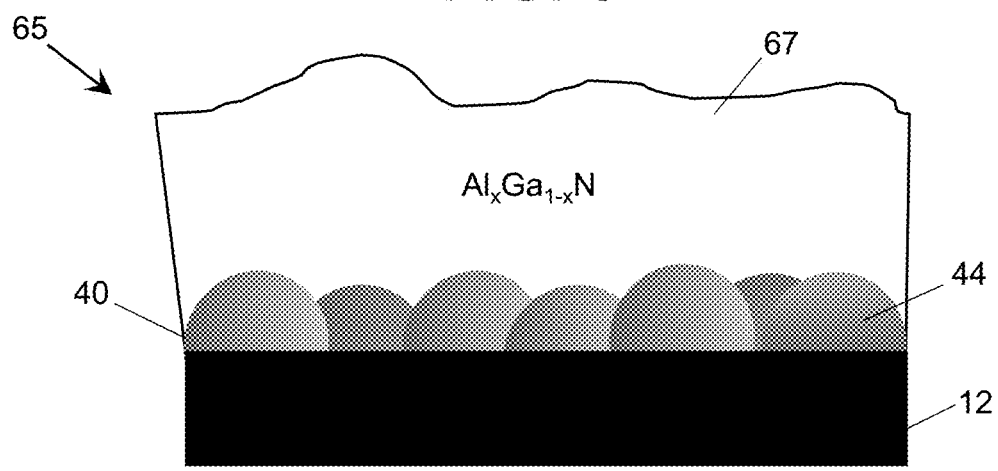
FIG. 8 shows a schematic of a semiconductor structure with a composite buffer layer of $Al_xGa_{1-x}N$ formed on a nucleation layer and a substrate that can be annealed prior to the epitaxial growth of subsequent layers according to an embodiment.

Also, it is understood that the buffer sub-layer 14B and the buffer sub-layer layer 14A can have the same composition to form a composite buffer layer. For example, the composite buffer layer can include an $Al_xGa_{1-x}N$ layer, an In layer or a B layer. In this manner, the composite buffer layer can be used in a variety of semiconductor structures used to form an optoelectronic device. For example, FIG. 8 shows a semiconductor structure 65 having a composite buffer layer 67 formed from $Al_xGa_{1-x}N$ that is grown on a nucleation layer 40 having nucleation islands 44, and a substrate 12. The semiconductor structure 65 can then be annealed in the aforementioned manner prior to epitaxially growing any additional layers. To this extent, any of the subsequent layers that are grown after annealing will have a reduced dislocation density and formation of cracks.

Figure 9:
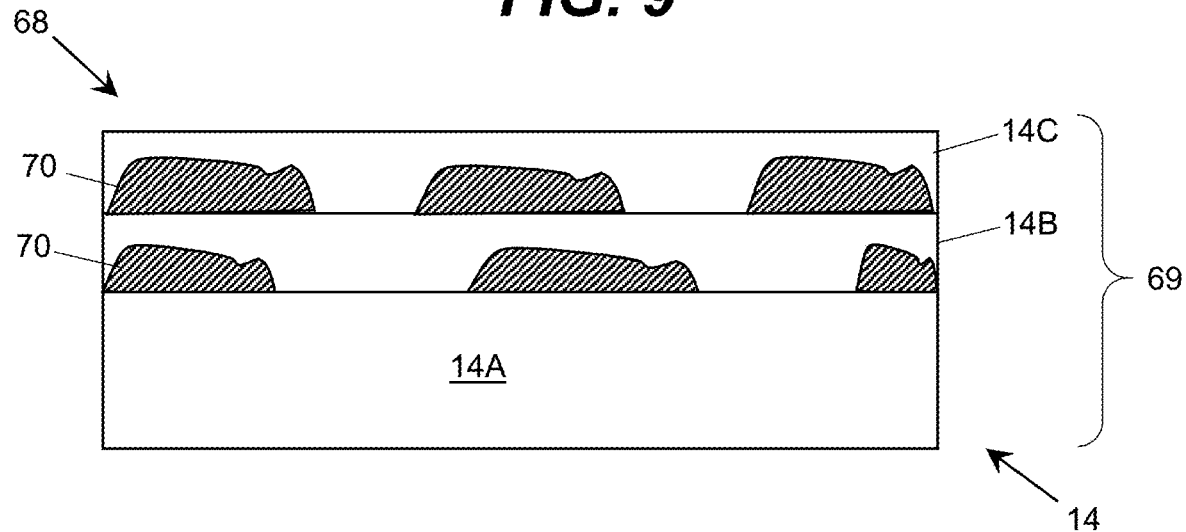
FIG. 9 shows a schematic of a buffer layer as a laminate structure having multiple buffer sub-layers with some sub-layers having laterally extending discontinuous island domains according to an embodiment.

Instead of having a semiconductor structure with a buffer layer formed of buffer sub-layers or sub-layers that are of the same composition to form a composite buffer layer, the semiconductor structure can utilize a buffer layer that is a laminate structure. FIG. 9 shows a schematic of a semiconductor structure 68 having a buffer layer 14 as a laminate structure 69 with multiple buffer sub-layers 14A, 14B, and 14C, with some sub-layers having laterally extending discontinuous island domains 70 according to an embodiment. As used herein a discontinuous island domains are regions containing voids between the regions. In one embodiment, each buffer sub-layer can have a composition that differs from a composition of an adjacent buffer sub-layer in the laminate structure 69. For example, buffer sub-layer 14A can include an $Al_{xa}Ga_{1-xa}N$ layer, buffer sub-layer 14B can include an $Al_{xb}Ga_{1-xb}N$ layer, and buffer sub-layer 14C can include an $Al_{xc}Ga_{1-xc}N$ layer. The discontinuous island domains 70 in those buffer sub-layers that have them can have compositions that differ from the compositions of discontinuous island domains in adjacent buffer sub-layers. For example, the discontinuous island domains 70 in buffer sub-layer 14B can have a composition of $Al_{xd}Ga_{1-xd}N$, while the discontinuous island domains 70 in buffer sub-layer 14C can have a composition of $Al_{xe}Ga_{1-xe}N$.

The laminate structure 69 of the buffer layer 14 with buffer sub-layers of varying composition and discontinuous island domains 70 enable the semiconductor structure 68 to obtain a more uniform desorption rate during annealing. In particular, purposely designing regions which are highly inhomogeneous will ensure the absence of regions having a large uniform composition, resulting in all regions having a relatively uniform desorption rate.

The semiconductor structure 68 depicted in FIG. 9 only shows the laminate structure 69 of the buffer layer 14 for clarity in describing the aspect that these layers have in regard to minimizing desorption during annealing. It is understood that the semiconductor structure 68 can have other layers. Furthermore, it is understood that the laminate structure 69 of the buffer layer 14 in the semiconductor structure 68 can include more buffer sub-layers with or without discontinuous island domains. Also, it is understood that the semiconductor structure 68 can have other layers epitaxially grown on the annealed laminate structure 69, as well semiconductor layers from a semiconductor heterostructure that form an optoelectronic device.

The buffer layer 14 with the laminate structure 69 depicted in FIG. 9 is only one example of a possible structure that can be configured with a semiconductor structure used in the formation of an optoelectronic device, and those skilled in the art will appreciate that other laminate structure configurations are possible. For example, FIG. 10 shows a schematic of a semiconductor structure 72 having a cap layer 42 formed on a buffer layer 14 having a laminate structure 74 with a set of alternating tensile stress sub-layers 75 and compressive stress sub-layers 77 according to an embodiment. The set of alternating tensile stress layers 75 and compressive stress layers 77 in the laminate structure 74 can be due to the lattice mismatch between sub-layers of the structure. For example, the lattice mismatch can be due to a compositional difference between the sub-layers that form the laminate structure 74. In one embodiment, the multiple buffer sub-layers of the laminate structure 74 can have a composition that differs by at least 5% from a composition of an adjacent layer. The lattice mismatch can also be due to the group V/III ratio used to grow the multiple buffer sub-layers. It is understood that the lattice mismatch can be obtained by varying other parameters during the epitaxial growth of this structure. For example, other parameters that can affect stresses within these multiple buffer sub-layers that form the laminate structure 74 can include changes in temperature and pressure when growing the sub-layers.

The laminate structure 74 of the buffer layer 14 with the set of alternating tensile stress sub-layers 75 and compressive stress sub-layers 77 enable the semiconductor structure 72 to further control the desorption rate during annealing. In particular, the desorption rate of a stressed layer is affected by the stresses within the layer.

Regardless of the type of desorption minimizing layer that is used with a buffer layer in forming a semiconductor structure for use with a semiconductor heterostructure of an optoelectronic device, those skilled in the art will appreciate that the semiconductor structure should be monitored for stresses during the annealing stage. Monitoring the semiconductor structure for stresses during annealing can include evaluating the curvature of the layers for bowing, determining the presence of dislocations in the layers, and detecting surface irregularities on the layers. This monitoring can be performed using well-known techniques such as for example, in-situ measurement of the deflection of parallel laser beams from the layer surfaces to evaluate the curvature, using x-ray diffraction to detect the presence of dislocations, and in-situ reflectance measurement to discern surface irregularities.

Figure 11A:
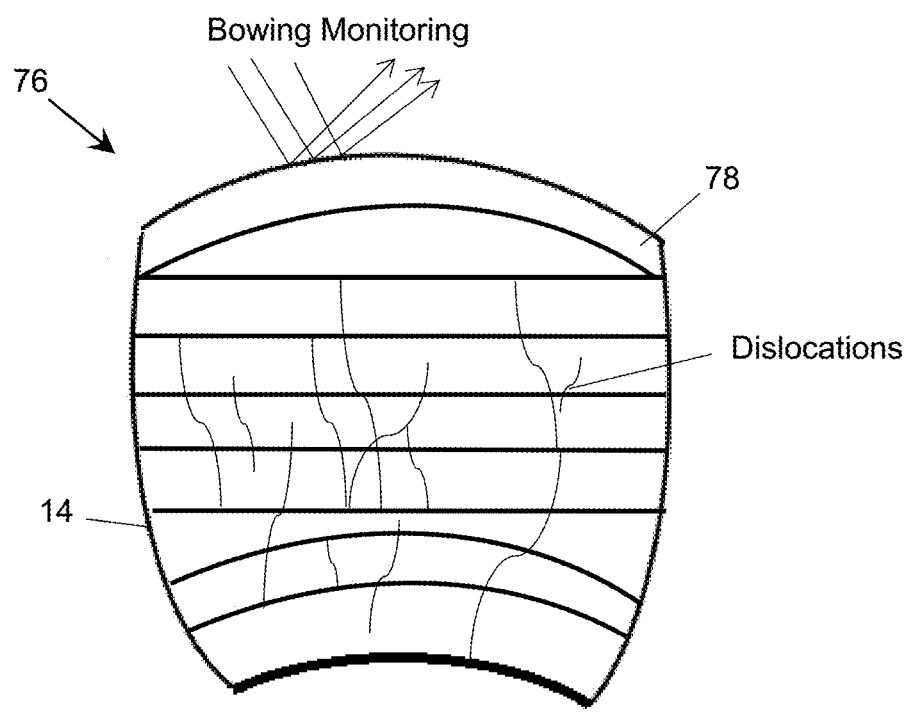

FIG. 11A illustrates an example of bowing that can occur in a semiconductor structure 76 having a buffer layer 14 and a desorption minimizing layer 78, which can include any of the forms discussed previously, and the presence of dislocations in the buffer layer 14 that can arise while annealing the structure. As shown in this example of FIG. 11A, the top and bottom surfaces of the semiconductor structure 76 are bowing outward from a central portion, and the buffer layer shows the presence of dislocations that are threading upward towards the desorption minimizing layer 78. In general, the bowing and threading of dislocations can occur because of the stresses within the epitaxially grown semiconductor layers.

Figure 11B:
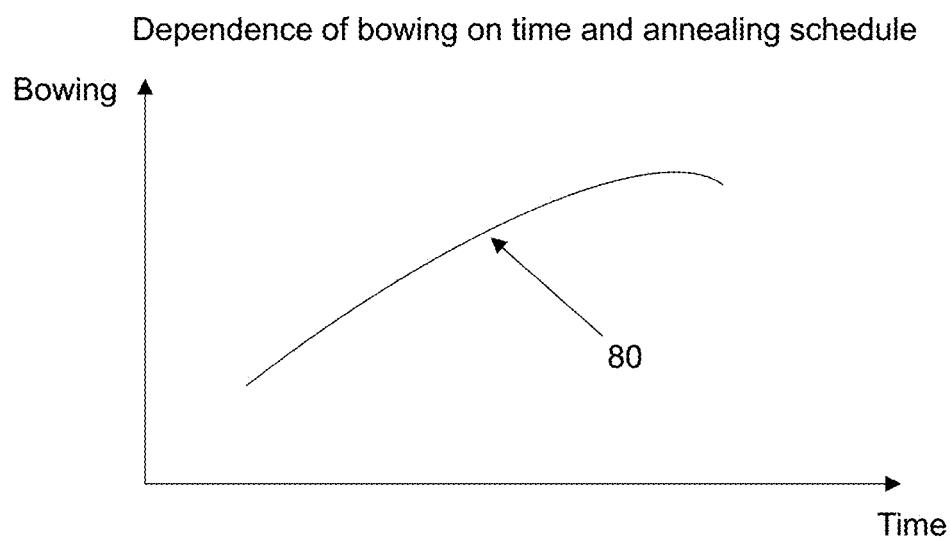
FIG. 11B shows the dependence of bowing on the annealing time.

As an illustrative example, FIG. 11B shows the dependence of bowing on the annealing time. In particular, FIG. 11B shows the time that bowing in the semiconductor structure 76, as represented by the reference numeral 80, begins to occur within the annealing process. In order to obviate the bowing, the annealing can be performed according to one of the embodiments described herein. For example, annealing a semiconductor structure according to an annealing profile that follows a predetermined time-dependent schedule as described with regard to FIG. 3 can prevent the bowing. It is understood that other changes to the annealing process can be made to prevent bowing and reduce the threading of dislocations such as chamber pressure, or the presence of the cap layer.

Figure 12A:
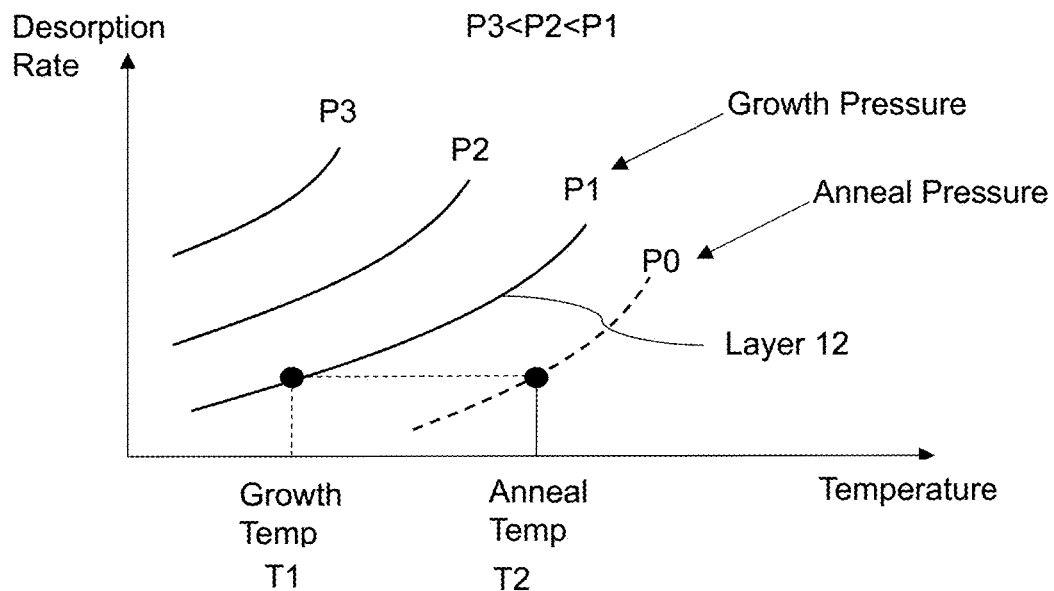
FIGS. 12A-12B show examples of qualitative sets of curves depicting the desorption rate of a semiconductor as a function of temperature and pressure, which can be used to form each of the layers in any of the semiconductor structures disclosed herein according to an embodiment.
Figure 12B:
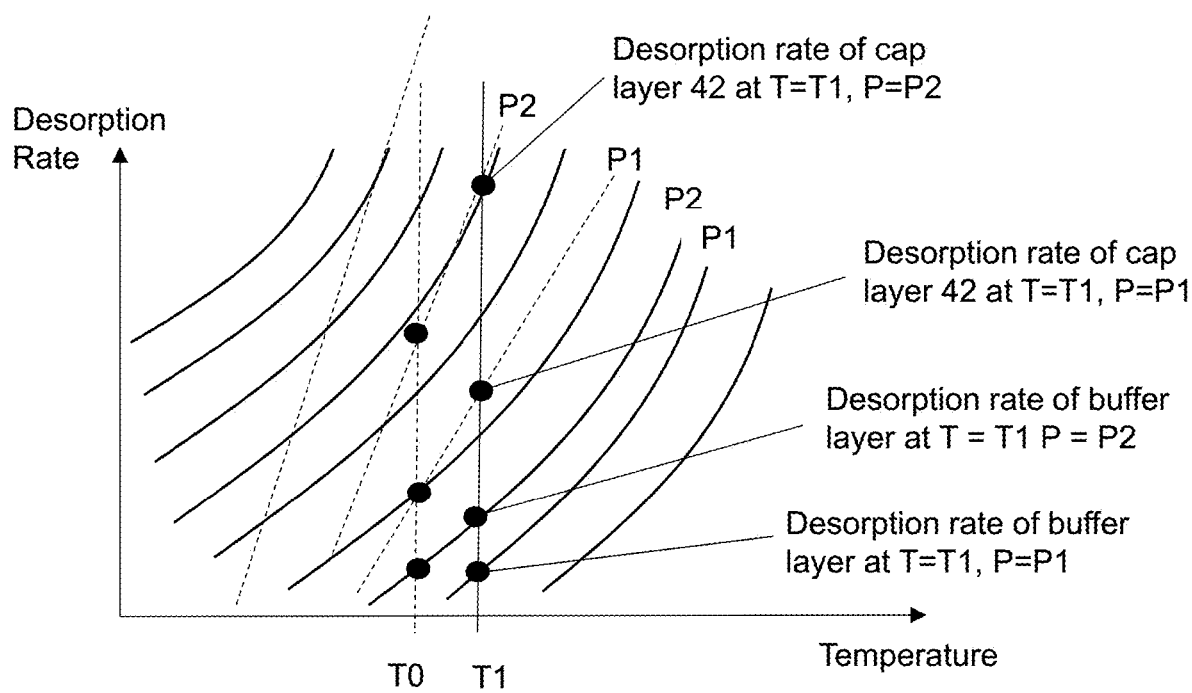

FIGS. 12A-12B show examples of qualitative sets of curves depicting the desorption rate of a semiconductor material as a function of temperature and pressure, which can be used to form each of the layers in any of the semiconductor structures disclosed herein. In particular, FIG. 12A shows that in each of the curves desorption is increased with an increase in temperature, while the set of the curves shows that the desorption is further increased with a reduction in the chamber pressure. It is understood that the exact dependence of the desorption rate on the chamber pressure and temperature embodied in these curves will depend on the type of semiconductor material in the layer that is grown and annealed. For example, consider a scenario in which the qualitative sets of curves in FIG. 12A are applied to an AlN semiconductor layer used as a buffer layer in a semiconductor structure. If T1 is the growth temperature of the AlN semiconductor layer, P1 is the growth pressure of the layer, T2 is the annealing temperature, and P0 is the annealing pressure, then it can be extrapolated from FIG. 12A that the desorption rate during annealing is largely the same as the desorption rate at the growth temperature T1 and the growth chamber pressure P1. FIG. 12A also makes clear that increasing the chamber pressure during the annealing can lead to a reduction of the desorption rate. With qualitative sets of curves like those depicted in FIG. 12A, a person skilled in optoelectronic devices and their fabrication can use the curves as guidance for altering growth parameters (e.g., temperature and pressure) to attain successful fabrication of a semiconductor heterostructure having quality layers with reduced dislocation densities and crack formations, which can improve the operational lifetime of the devices.

The qualitative curves of FIG. 12B show that the desorption rate can depend on pressure and temperature quite differently for semiconductor layers having different compositions. For instance, the change of desorption rate as a function of temperature can be higher for a semiconductor layer having a high Ga content. Consider the example illustrated in FIG. 12B in which a cap layer 42 can have a desorption rate that is higher than the desorption rate of a buffer layer during the annealing of the buffer layer at the same temperature. In this scenario, the desorption rate of the cap layer 42 can be easily controlled through a variation in the chamber pressure. For example, during the annealing, the chamber pressure can be increased to attain low desorption of the semiconductor layers. However, after annealing of the layers, both the temperature and the pressure can be decreased. This can result in a quick desorption (e.g., the chamber pressure can be reduced below 700 torr to attain complete desorption) of the cap layer 42, but with a slow desorption (e.g., by maintaining chamber pressure at or above 100 torr to keep the desorption rate lower) of the buffer layer.

To this extent, a person skilled in optoelectronic devices and their fabrication can use the curves of FIG. 12B to control the desorption of a semiconductor layer in a semiconductor structure as a function of temperature and pressure. For example, a desorption rate of a cap layer that is used in a semiconductor structure with a buffer layer per one of the embodiments described herein, can be controlled through a variation in chamber pressure. In one embodiment, the controlling can include increasing the chamber pressure during the annealing to lower the desorption rate of the cap layer, and decreasing the chamber pressure after the annealing as the temperature decreases in order to quicken the desorption of the cap layer while slowing the desorption from the buffer layer.

Figure 13:
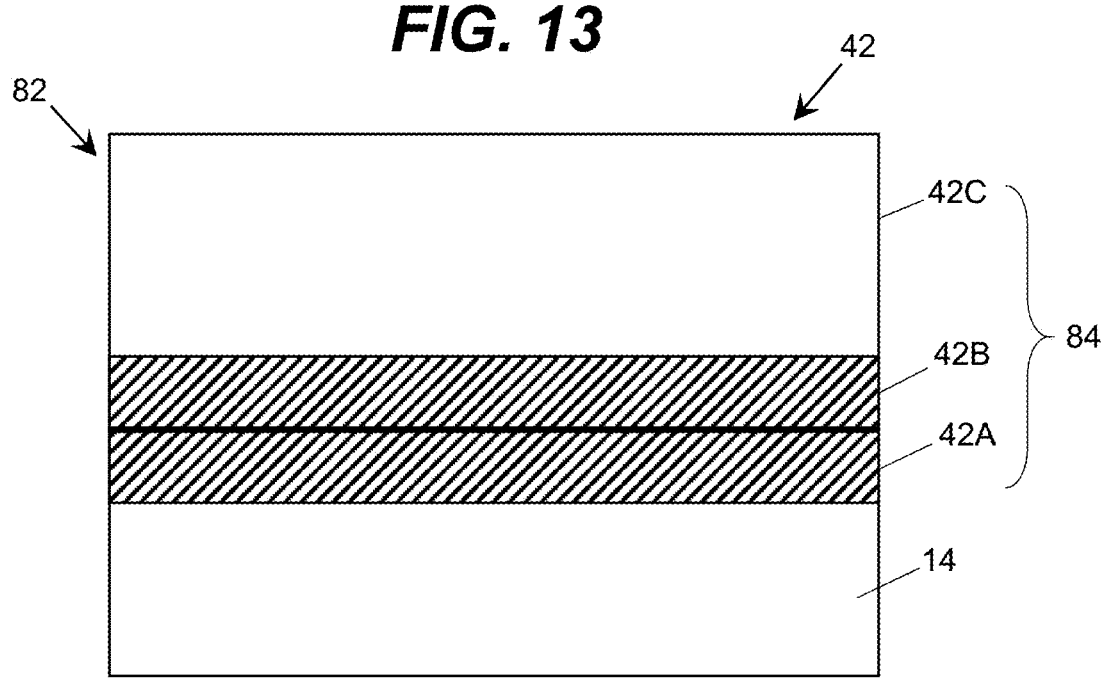
FIG. 13 shows a schematic of a semiconductor structure having a buffer layer with a cap layer having a laminate structure formed on the buffer layer that is suitable for use with a semiconductor heterostructure like the one depicted in FIG. 1 according to an embodiment.

FIG. 13 shows a schematic of a semiconductor structure 82 having a buffer layer 14 with a cap layer 42 having a laminate structure 84 formed on the buffer layer that is suitable for use with a semiconductor heterostructure like the one depicted in FIG. 1. In one embodiment, the laminate structure 84 of the cap layer 42 can include a multiple of cap sub-layers. In FIG. 13, the laminate structure 84 of the cap layer 42 includes cap sub-layers 42A, 42B and 42C. Although FIG. 13 only shows three cap sub-layers, it is understood that the laminate structure 84 can include more than three cap sub-layers. Further, it is understood that for clarity, FIG. 13 only shows the buffer layer 14 and the cap layer 42 including the laminate structure 84 of layers. Those skilled in the art will appreciate that the semiconductor structure 82 can have other layers including, but not limited to, a substrate and a nucleation layer.

In one embodiment, each of the cap sub-layers 42A, 42B and 42C of the laminate structure 84 of the cap layer 42 can have different desorption rates. For example, the cap sub-layer 42A can have a high composition of Ga or In with a high desorption rate, while the other cap sub-layers 42B and 42C can have slower desorption rates that is provided by certain layers, like for example, AlGaN layers with a high molar fraction of AlN. As used herein, a high composition of a group III metal means that the group III metal content of the layer is higher than the content of the other group three metals. A slower desorption rate can result from an Al content in the layer being relatively higher than the content of the other group three metals.

Using the cap layer 42 with a laminate structure 84 of cap sub-layers formed on the buffer layer 14 can be beneficial in several areas with regard to the formation of the semiconductor structure 82. For example, the cap layer(s) 42 can serve as composition grading layers to reduce lattice mismatch with other device layers. Also, the cap layers(s) 14 can be used as sacrificial layers for subsequent substrate removal.

Figure 14:
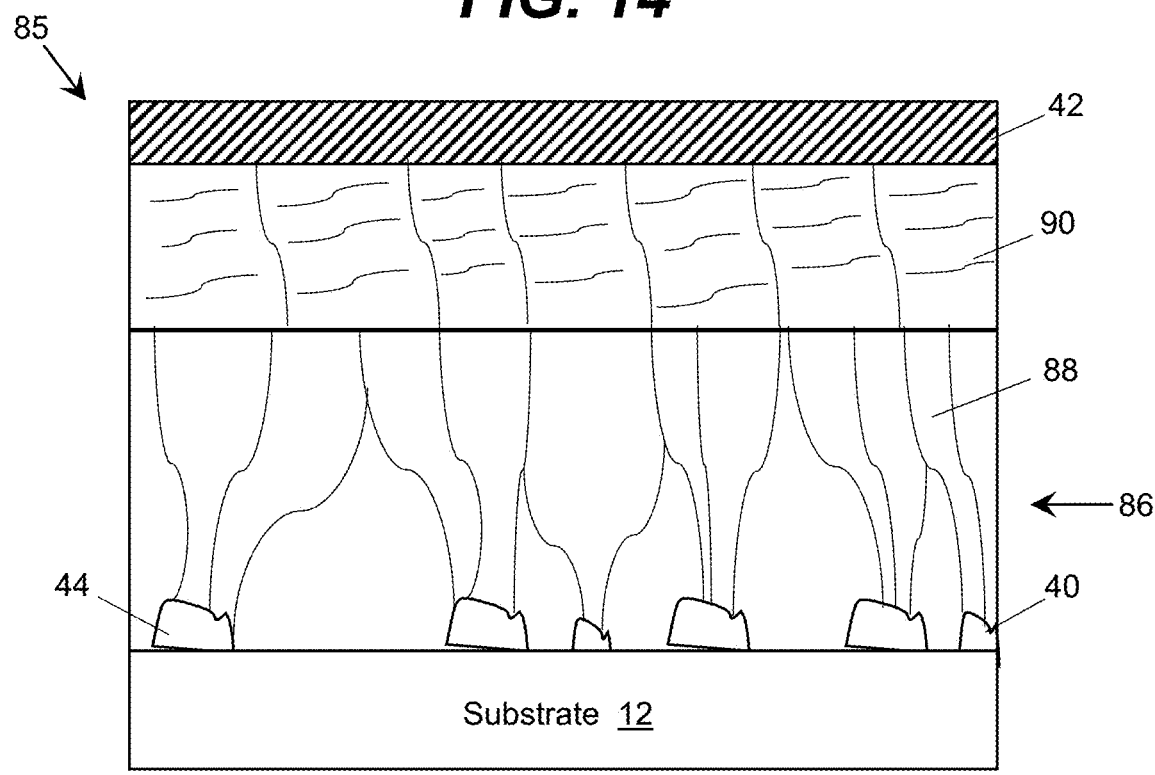
FIG. 14 shows a schematic of a semiconductor structure having a buffer layer with vertically extending nanostructures with a cap layer formed on the buffer layer that is suitable for use with a semiconductor heterostructure like the one depicted in FIG. 1 according to an embodiment.

FIG. 14 shows a schematic of a semiconductor structure 85 having a buffer layer 86 formed on a nucleation layer 40 with nucleation islands 44 and a substrate 12, with a cap layer 42 formed on the buffer layer that is suitable for use with a semiconductor heterostructure like the one depicted in FIG. 1. In the embodiment of FIG. 14, the buffer layer 86 can include a set of vertically extending nanostructures 88 formed on the nucleation layer 40 and a horizontal extending region 90 formed between the cap layer 42 and the nanostructures. With this configuration, the stresses within the subsequent layers can be reduced. In addition, the configuration ensures that any additional semiconductor layers of the semiconductor structure 85 and layers of a semiconductor heterostructure associated with an optoelectronic device that is formed on the semiconductor structure 85 can have a reduced dislocation density and crack formation due to threading dislocation bending and defect annihilation.

In one embodiment, the set of vertically extending nanostructures 88 can include a set of nanopillars formed on the nucleation islands 44. The set of nanopillars and the horizontal extending region 90 formed between the cap layer 42 and the nanopillars can be formed by coalescence of the nanopillars. U.S. Pat. No. 9,818,826, which is hereby incorporated by reference, provides more details of forming nanostructures such as nanopillars, and a lateral growth region in a buffer layer for promoting stress relief in a semiconductor structure.

Figure 15:
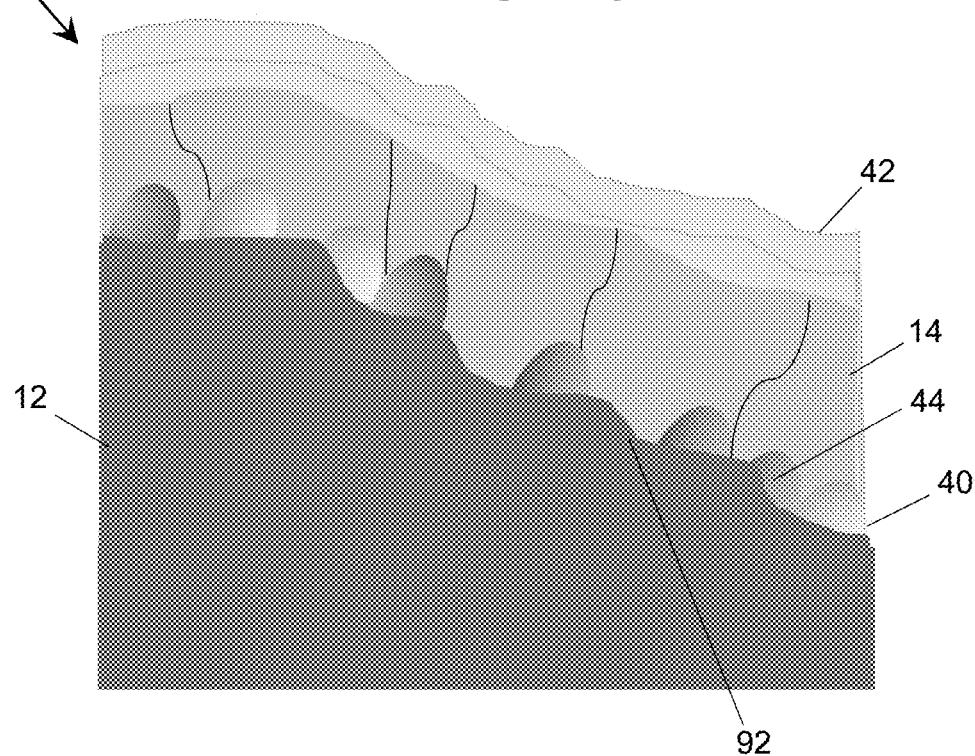
FIG. 15 shows a schematic of a semiconductor structure having an inclined substrate with a nucleation layer, a buffer layer and a cap layer each inclined to conform with the substrate according to an embodiment.

FIG. 15 shows a schematic of a semiconductor structure 91 having an inclined substrate 12 with a nucleation layer 40 including nucleation islands 44, a buffer layer 14 and a cap layer 42 each inclined to conform with the substrate according to an embodiment. As shown in FIG. 15, the substrate 12 can include an inclined surface 92. In one embodiment, the inclined surface 92 of the substrate 12 can include a series of steps progressing upward from one end of the substrate to another end of the substrate. In one embodiment, the series of steps can take the form of shallow steps having a height that ranges from one atomic step to about ten atomic steps. To this extent, the nucleation layer 40, the buffer layer 14, and the cap layer 42 can be epitaxially grown with an inclined surface that conforms with the inclined surface of the substrate 12. The inclined surface 92 of the substrate 12 as well as the inclined nucleation layer 40, the inclined buffer layer 14, and the inclined cap layer 42 can be formed by polishing and/or etching the substrate. It is understood that the embodiment depicted in FIG. 15 is not meant to be limited to the layers that form the semiconductor structure 91, but instead this aspect of utilizing an inclined layer is suitable for use with other structures that include any of the aforementioned desorption minimizing layers. Likewise, any semiconductor heterostructure of an optoelectronic device that is formed on an inclined-shaped semiconductor structure can have its layers inclined to conform with this shape.

By combining the inclined shape of the layers that form the semiconductor structure 91 with the annealing methodologies described herein, it is possible to attain a structure, and ultimately an optoelectronic device, with reduced dislocation density in the layers and an improvement in the quality of layers. In particular, bending of threading dislocations is increased when semiconductor layers are grown on slightly inclined surfaces.

Figure 16:
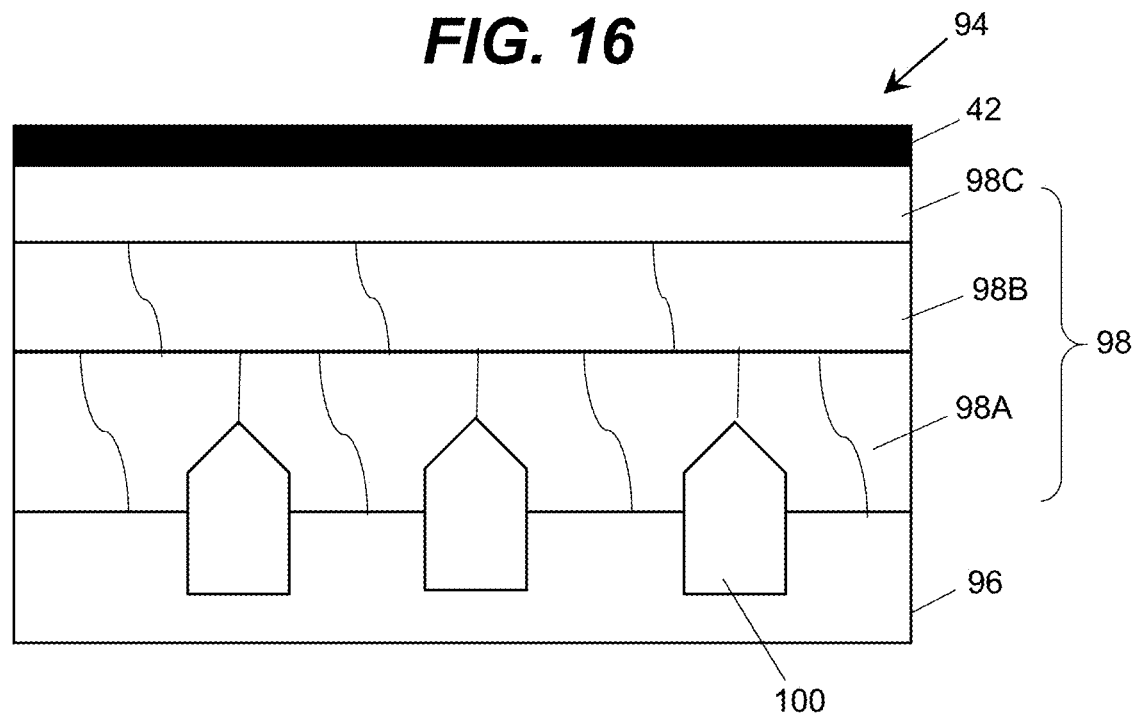
FIG. 16 shows a schematic of a semiconductor structure having a patterned substrate with a buffer layer and a cap layer formed on the substrate according to an embodiment.

FIG. 16 also shows another structure that can have reduced dislocation density and an improvement in the quality of layers when combined with the annealing approaches described herein. In particular, FIG. 16 shows a schematic of a semiconductor structure 94 having a patterned substrate 96 with a buffer layer 98 and a cap layer 42 formed on the substrate according to an embodiment. In this embodiment, the buffer layer 98 can include a cavity containing layer 98A containing cavities or voids 100 formed over the patterned substrate 96, a first group III nitride semiconductor layer 98B formed on the cavity containing layer 98A, and a second group III nitride semiconductor layer 98C formed on the first group III nitride semiconductor layer 98B.

In one embodiment, the patterned substrate 96 can be patterned with elevated regions (e.g., hills) with flat depressions (e.g., valleys) formed between each of the elevated regions, however, it is understood that different patterning shapes can be used. The patterning shapes can comprise regions having at least one dimension in a range of several microns or several tens of microns. The buffer layer 98 can be epitaxially grown on the elevated regions and flat depressions of the substrate. In one embodiment, as shown in FIG. 16, portions of the cavities 100 of the buffer layer 98 can be formed within the flat depressions of the patterned substrate with the remaining portion of the cavities positioned in the buffer layer. In this manner, the cavities 100 of the semiconductor structure 94 extend into the substrate 96 and buffer layer 98. This configuration results in a set of stress control regions or domains in the structure 94 that are spaced apart from each other at a predetermined distance. Essentially, the patterned substrate 96 and the cavity containing layer 98A with cavities 100 act as a stress relieving layer for the remainder layers of the semiconductor structure 94 including the rest of the buffer layer 98 (i.e., the first group III nitride semiconductor layer 98B and the second group III nitride semiconductor layer 98C) and the cap layer 42, as well as any semiconductor heterostructure of an optoelectronic device that is formed on the structure 94.

It is understood that the semiconductor structure 94 represents only one possible implementation of a structure with a patterned substrate. Those skilled in the art will appreciate that the patterned substrate 96 can be used with any of the other semiconductor structures described herein to enable a stress relieving benefit to the structure. For example, a nucleation layer can be formed on the patterned substrate, while the buffer layer 98 including the cavity containing layer 98A and the first group III nitride semiconductor layer 98B and the second group III nitride semiconductor layer 98C can be formed on the nucleation layer. Also, it is understood that the buffer layer 98 can include one or more cavity containing layers, and more or less of the group III nitride semiconductor layers than that depicted in FIG. 16.

Both the first group III nitride semiconductor layer 98B and the second group III nitride semiconductor layer 98C can be formed to complement the cavity containing layer 98A in providing a stress relieving functionality to the semiconductor structure 94. For example, the first group III nitride semiconductor layer 98B and the second group III nitride semiconductor layer 98C, which can include of the any of aforementioned materials can have compositions that differ from each other by a predetermined amount (e.g., at least one percent) in order to achieve a target distribution of elastic properties in the buffer layer 98 that can result in a target distribution of stresses throughout the structure 94. In another embodiment, the first group III nitride semiconductor layer 98B and the second group III nitride semiconductor layer 98C can have graded compositions in which a molar fraction of one or more elements in the layers varies between different layers and/or within a layer. To this extent, grading the compositions in this manner also enables a targeted distribution of stresses to be attained in the buffer layer 98. U.S. Pat. No. 9,330,906 provides additional details of utilizing a buffer layer with cavity containing layers and additional semiconductor layers formed thereon in order to provide stress relief to a semiconductor structure, and is incorporated herein by reference.

By combining the annealing methodologies described herein on the semiconductor structure 94 with a multilayered buffer layer having at least one cavity containing layer formed on a patterned substrate, it is possible to produce a structure, and ultimately an optoelectronic device, with reduced dislocation density in the layers and an improvement in the quality of layers. In particular, a multilayered buffer layer having cavities affects the overall stresses within the subsequently grown semiconductor layers, whereas annealing leads to dislocation annihilation.

The annealing processes described herein can be used to grow multiple epitaxial buffer layers on multiple substrates (e.g., wafers) for use in forming semiconductor structures like those disclosed herein, as well as any semiconductor heterostructures of optoelectronic devices that are intended to operate with the structures. For example, many wafers can be processed at once in a large commercial MOCVD chamber to produce a plurality of buffer layers including, but not limited to, those structures described herein.

The wafers can then be removed from the MOCVD chamber and stacked to ensure that each buffer layer cannot be easily desorbed during the annealing. In addition, the stacks can be surrounded from top and bottom by substrates. These stacked configurations can then be placed in an annealing chamber and annealed to result in template structures (i.e., a buffer layer formed over a substrate) that can be used for subsequent growth of other layers in a semiconductor structure or heterostructure. In a typical implementation, the chamber pressure can be increased to prevent desorption of the layers during the annealing process. Any of these implementations that are deployed during the annealing will allow the stacks to have minimized presence of dislocations including reduced dislocation density in the structures that are formed thereon, and improved quality of the layers with less cracks.

Figure 17A:
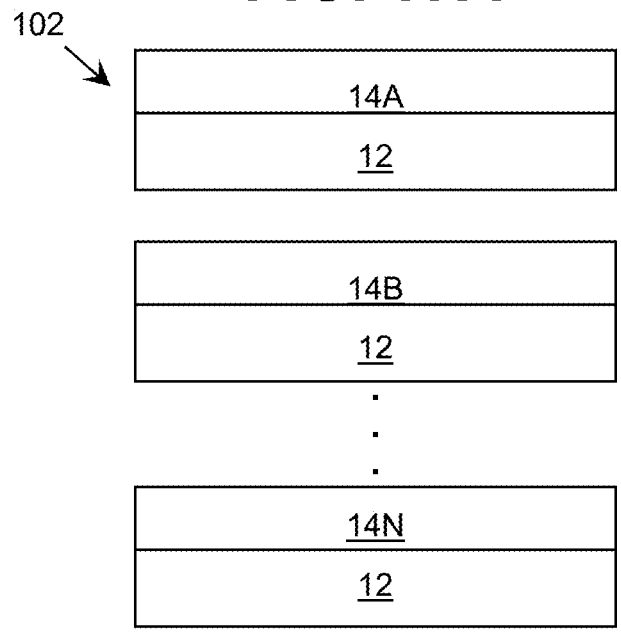
FIGS. 17A-17B illustrate the formation and annealing of a semiconductor structure having stacks of layers that are suitable for use as templates for growth of a semiconductor heterostructure like the one depicted in FIG. 1 according to an embodiment.
Figure 17B:
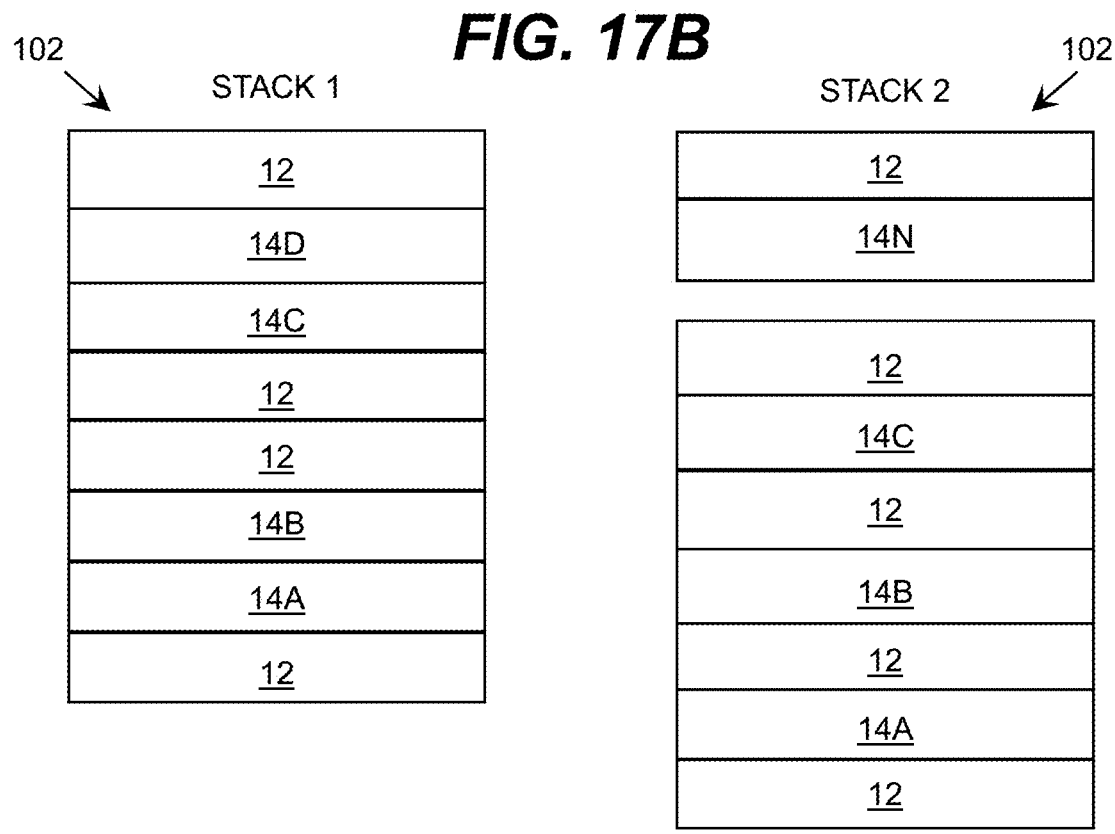

FIGS. 17A-17B illustrate the formation and annealing of semiconductor structures 102 having stack of layers that are suitable for use as templates for growth of semiconductor heterostructures like one depicted in FIG. 1. As shown in FIG. 17A, the process can begin by obtaining a plurality of substrates 12 each having a buffer layer 14 (14A, 14B, . . . 14N) formed on a substrate. In one embodiment, the substrates and corresponding buffer layers can be epitaxially grown in a growth chamber (e.g., in a large MOCVD chamber). Although not shown in FIG. 17A, it is understood that each substrate and buffer layer structure can have other layers (e.g., nucleation layers, desorption minimizing layers, cap layers, etc.) formed on the structure.

FIG. 17B shows that the N units of structures depicted in FIG. 17A can be stacked in multiple stacking configurations that ensure that each buffer layer cannot be easily desorbed during the annealing. In one embodiment, the buffer layers from each of the structures can be positioned to face the buffer layer of an adjoining structure, such that each of the buffer layers from an adjoining pair are sandwiched between the substrates 12 of the pair. For example, FIG. 17B shows a Stack 1 with buffer layers 14A and 14B facing each other and positioned between the substrates 12 of the adjoining pair. A similar relationship is shown in this Stack 1 with respect to buffer layers 14C and 14D and their corresponding substrates 12. This stacking arrangement ensures that each of the buffer layers cannot be easily desorbed during annealing.

As shown in FIG. 17B, multiple stacks of the structures schematically depicted in FIG. 17A can be formed in other arrangements that ensure that the buffer layers will not be easily desorbed. For example, Stack 2 shows the buffer layers 14 from the structures of FIG. 17A stacked in an arrangement where each buffer layer is positioned between a pair of substrates 12. To this extent, the buffer layers (e.g., 14A, 14B, 14C, . . . 14N) are surrounded at the top and bottom by substrates.

After formation, the Stacks 1 and 2 from FIG. 17B can undergo annealing to form template structures for subsequent semiconductor layer growth. In one embodiment, the annealing of the stacks includes heating the stacks to temperatures of 1400° C. or higher. In an embodiment, the ambient pressure can also be increased, e.g., by several times. It is understood that other annealing parameters including, but not limited to those mentioned above, can be deployed to yield templates that will reduce dislocation density and improve semiconductor layers of structures formed on the templates.

It is understood that the various embodiments can utilize other technological advances to supplement the annealing of the semiconductor structures in order to prevent desorption and improve the quality of layers in the semiconductor structures that are undergoing the annealing operations described herein. For example, partial annealing can be conducted through the use of a laser beam directed to a surface of the semiconductor structures that are subject to the annealing described herein. In particular, during the annealing process, the temperature of the semiconductor layers can be increased following specific time dependent temperature profile. At the same time, the laser can be applied to a region of the surface to result in localized heating and annealing. In one embodiment, the wavelength of the laser beam can be selected to be absorbent by the semiconductor layers of the structures that are requiring annealing. In an embodiment, application of the laser beam can be to the regions of the surface that contain a large number of dislocations that can be inferred, for example, from optical measurements, such as measurements of reflection from the surface.

Figure 18:
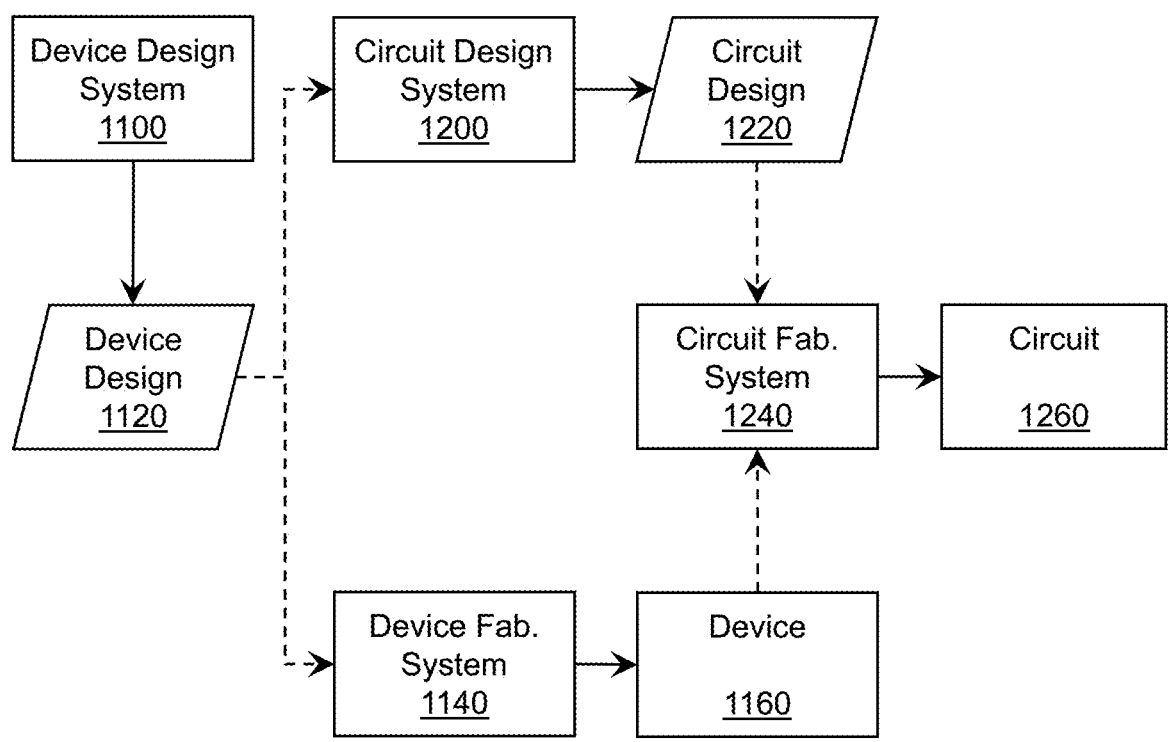
FIG. 18 shows an illustrative flow diagram for fabricating an optoelectronic device and semiconductor heterostructure including any of the semiconductor structures described herein according to one of the various embodiments.

In one embodiment, the invention provides a method of designing and/or fabricating a circuit that includes one or more of optoelectronic devices and semiconductor heterostructures having any of the semiconductor structures described herein. To this extent, FIG. 18 shows an illustrative flow diagram for fabricating a circuit 1260 according to an embodiment. Initially, a user can utilize a device design system 1100 to generate a device design 1120 for an optoelectronic semiconductor device as described herein. The device design 1120 can comprise program code, which can be used by a device fabrication system 1140 to generate a set of physical devices 1160 according to the features defined by the device design 1120. Similarly, the device design 1120 can be provided to a circuit design system 1200 (e.g., as an available component for use in circuits), which a user can utilize to generate a circuit design 1220 (e.g., by connecting one or more inputs and outputs to various devices included in a circuit). The circuit design 1220 can comprise program code that includes a device designed as described herein. In any event, the circuit design 1220 and/or one or more physical devices 1160 can be provided to a circuit fabrication system 1240, which can generate a physical circuit 1260 according to the circuit design 1220. The physical circuit 1260 can include one or more devices 1160 designed as described herein.

In another embodiment, the invention provides a device design system 1100 for designing and/or a device fabrication system 1140 for fabricating a semiconductor device 1160 as described herein. In this case, the system 1100, 1140 can comprise a general purpose computing device, which is programmed to implement a method of designing and/or fabricating the semiconductor device 1160 as described herein. Similarly, an embodiment of the invention provides a circuit design system 1200 for designing and/or a circuit fabrication system 1240 for fabricating a circuit 1260 that includes at least one device 1160 designed and/or fabricated as described herein. In this case, the system 1200, 1240 can comprise a general purpose computing device, which is programmed to implement a method of designing and/or fabricating the circuit 1260 including at least one semiconductor device 1160 as described herein. In either case, the corresponding fabrication system 1140, 1240, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1100 to generate the device design 1120 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1100 for designing and/or a device fabrication system 1140 for fabricating an optoelectronic semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method, comprising:
   epitaxially growing a nucleation layer on a substrate, the nucleation layer including a group III nitride semiconductor layer;
   epitaxially growing a buffer layer directly on the nucleation layer, the buffer layer grown at a first temperature T1;
   annealing the epitaxially grown buffer layer and the nucleation layer at a second temperature T2, wherein the second temperature T2 is greater than the first temperature T1, wherein the second temperature T2 conforms to a predetermined time-dependent schedule, wherein a first portion of the annealing includes heating the nucleation layer and the buffer layer with a temperature that increases a few tens of degrees Celsius per minute until reaching a peak temperature that ranges from about 1400° Celsius to about 1900° Celsius, a second portion of the annealing includes heating the nucleation layer and the buffer layer at the peak temperature with any variation from the peak temperature including a few degrees Celsius per minute, and a third portion of the annealing includes cooling the nucleation layer and the buffer layer with a temperature that decreases a few tens of degrees Celsius per minute from the temperature of the relatively constant heating of the second portion; and
   epitaxially growing an n-type doped semiconductor layer over the annealed buffer layer.

2. A method of epitaxially growing a semiconductor structure with low dislocation density, comprising:
   obtaining a substrate;
   epitaxially growing a nucleation layer on the substrate, the nucleation layer including a group III nitride semiconductor layer;
   epitaxially growing a buffer layer on the nucleation layer at a first temperature T1, the buffer layer including a group III nitride semiconductor layer;
   epitaxially growing a desorption minimizing layer on the buffer layer;
   annealing the nucleation layer, the buffer layer and the desorption minimizing layer at a second temperature T2, wherein the second temperature T2 is greater than the first temperature T1; and
   epitaxially growing at least one semiconductor layer over the annealed buffer layer.

3. The method of claim 2, wherein the second temperature T2 conforms to a predetermined time-dependent schedule, wherein a first portion of the annealing includes a relatively fast heating of the nucleation layer, the buffer layer and the desorption minimizing layer with a temperature that increases a few tens of degrees Celsius per minute until reaching a peak temperature that ranges from about 1400° Celsius to about 1900° Celsius, a second portion of the annealing includes a relatively constant heating of the nucleation layer, the buffer layer and the desorption minimizing layer at the peak temperature with any variation from the peak temperature including a few degrees Celsius per minute, and a third portion of the annealing includes a relatively slow cooling of the nucleation layer, the buffer layer and the desorption minimizing layer with a temperature that decreases a few tens of degrees Celsius per minute from the temperature of the relatively constant heating of the second portion.

4. The method of claim 2, wherein the buffer layer and the desorption minimizing layer comprise the same composition to form a composite buffer layer.

5. The method of claim 4, further comprising supplying metalorganic gases containing Al and Ga atoms during the annealing of the composite buffer layer and selecting a chamber pressure and a chamber temperature that attains a predetermined amount of absorption of Al and Ga atoms on the surface of the composite buffer layer during the annealing, wherein the predetermined amount of absorption of Al and Ga balances a rate of desorption of Al and Ga atoms from the composite buffer layer during the annealing.

6. The method of claim 2, wherein the epitaxially growing of the desorption minimizing layer comprises epitaxially growing a cap layer.

7. The method of claim 6, wherein the cap layer comprises a group III nitride semiconductor, wherein the cap layer has a composition that is 5% or more different from the composition of the buffer layer.

8. The method of claim 6, further comprising controlling a desorption rate of the cap layer and the buffer layer through a variation in chamber pressure, the controlling including increasing the chamber pressure during the annealing to lower the desorption rate of the cap layer, and decreasing the chamber pressure after the annealing as the temperature decreases from the second temperature T2 in order to quicken the desorption of the cap layer while slowing the desorption from the buffer layer.

9. The method of claim 6, wherein the epitaxially growing of the cap layer comprises forming a laminate structure having multiple cap sub-layers, wherein each cap sub-layer comprises a different desorption rate.

10. The method of claim 6, further comprising removing the cap layer after annealing prior to epitaxially growing the at least one semiconductor layer.

11. The method of claim 2, wherein the epitaxially growing of the buffer layer comprises forming more than one buffer sub-layer, wherein each buffer sub-layer comprises a quaternary or ternary alloy.

12. The method of claim 11, wherein one of the buffer sub-layers comprises an $Al_xGa_{1-x}N$ layer with a Ga composition that varies laterally across the buffer sub-layer, wherein regions in the $Al_xGa_{1-x}N$ layer with higher Ga composition have a higher desorption rate than regions in the $Al_xGa_{1-x}N$ layer with higher Al composition.

13. The method of claim 2, wherein the epitaxially growing of the buffer layer comprises forming a laminate structure having multiple buffer sub-layers, wherein each buffer sub-layer comprises a composition that differs from a composition of adjacent buffer sub-layers in the laminate structure.

14. The method of claim 2, wherein the obtaining of a substrate comprises obtaining a plurality of substrates, and further comprising epitaxially growing a nucleation layer, and a buffer layer on each of the plurality of substrates; stacking the nucleation layers, the buffer layers and the desorption minimizing layers in a configuration that minimizes desorption of the buffer layers, wherein a top portion and a bottom portion of the stacking each comprises a substrate; epitaxially growing an additional stacking of semiconductor layers; and annealing the stackings to form individual template structures for subsequent semiconductor layer growth.

15. An optoelectronic device comprising a structure prepared in accordance with the method of claim 2, the optoelectronic device including one of a light emitting diode, a photodiode, a photodetector, an ultraviolet light emitting diode and a laser diode.

16. A method of epitaxially growing a semiconductor structure with low dislocation density, comprising:
- obtaining a substrate;
- epitaxially growing a nucleation layer on the substrate, the nucleation layer including a group III nitride semiconductor layer;
- epitaxially growing a buffer layer on the nucleation layer at a first temperature T1, the buffer layer including a group III nitride semiconductor layer;
- epitaxially growing a cap layer on the buffer layer;
- annealing the nucleation layer, the buffer layer and the cap layer at a second temperature T2, wherein the second temperature T2 is greater than the first temperature T1;
- removing the cap layer after the annealing; and
- epitaxially growing an n-type semiconductor layer on the annealed buffer layer.

17. The method of claim 16, further comprising epitaxially growing an additional buffer layer on the annealed buffer layer and epitaxially growing a new cap layer on the additional buffer layer.

18. The method of claim 17, further comprising annealing the additional buffer layer and the new cap layer.

19. The method of claim 18, further comprising removing the new cap layer.

20. The method of claim 19, further comprising repeating the epitaxially growing of more buffer layers and cap layers, annealing and removing of the cap layers.

* * * * *